United States Patent
Hirokawa et al.

(10) Patent No.: US 7,101,257 B2
(45) Date of Patent: Sep. 5, 2006

(54) SUBSTRATE POLISHING APPARATUS

(75) Inventors: Kazuto Hirokawa, Tokyo (JP); Yoichi Kobayashi, Tokyo (JP); Shunsuke Nakai, Tokyo (JP); Shinro Ohta, Tokyo (JP); Yasuo Tsukuda, Osaka (JP)

(73) Assignees: Ebara Corporation, Tokyo (JP); Shimadzu Corporation, Kyoto (JP)

( * ) Notice: Subject to any disclaimer, the term of this patent is extended or adjusted under 35 U.S.C. 154(b) by 0 days.

(21) Appl. No.: 10/617,789

(22) Filed: Jul. 14, 2003

(65) Prior Publication Data

US 2004/0235393 A1    Nov. 25, 2004

(30) Foreign Application Priority Data

May 21, 2003   (JP)   ............................. 2003-143526
May 21, 2003   (JP)   ............................. 2003-143527

(51) Int. Cl.
  *B24B 49/00*  (2006.01)
  *B24B 5/02*   (2006.01)
(52) U.S. Cl. ............................ 451/6; 451/9; 451/285
(58) Field of Classification Search .................... 451/6, 451/5, 8, 285–289, 9–11
   See application file for complete search history.

(56) References Cited

U.S. PATENT DOCUMENTS 5,762,536 A * 6/1998 Pant et al. .................. 451/6
6,599,765 B1 * 7/2003 Boyd et al. .................. 451/6
6,628,397 B1 * 9/2003 Nikoonahad et al. ........ 356/445
6,707,540 B1 * 3/2004 Lehman et al. ............... 451/6
6,758,723 B1 * 7/2004 Kobayashi et al. ........... 451/6
6,785,010 B1 * 8/2004 Kimba et al. ................. 451/5
2001/0005265 A1 * 6/2001 Kimba et al. ............... 356/630
2003/0181139 A1 * 9/2003 Lehman et al. ................ 451/8

* cited by examiner

Primary Examiner—Hadi Shakeri
(74) Attorney, Agent, or Firm—Wenderoth, Lind & Ponack, L.L.P.

(57) ABSTRACT

A substrate polishing apparatus polishes a substrate such as a semiconductor wafer to a flat mirror finish. The substrate polishing apparatus has a polishing table against which a substrate is pressed and a light-emitting and light-receiving device to emit measurement light from the polishing table to the substrate and to receive reflected light from the substrate for measuring a film on the substrate. The substrate polishing apparatus also has a fluid supply passage for supplying a fluid for measurement, through which the measurement light and the reflected light pass, to a fluid chamber provided at a light-emitting and light-receiving position of the polishing table, and a fluid supply control device for controlling supply of the fluid for measurement to the fluid chamber.

4 Claims, 28 Drawing Sheets

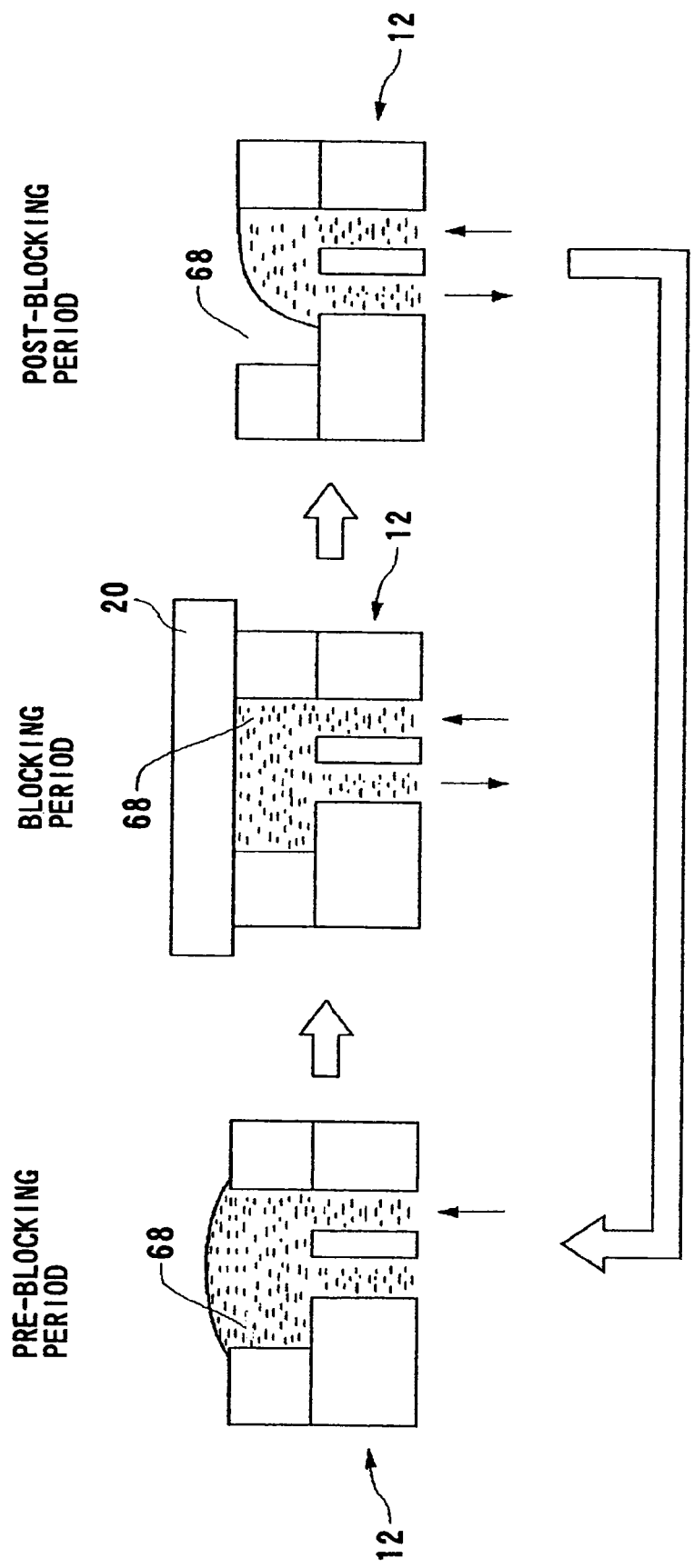

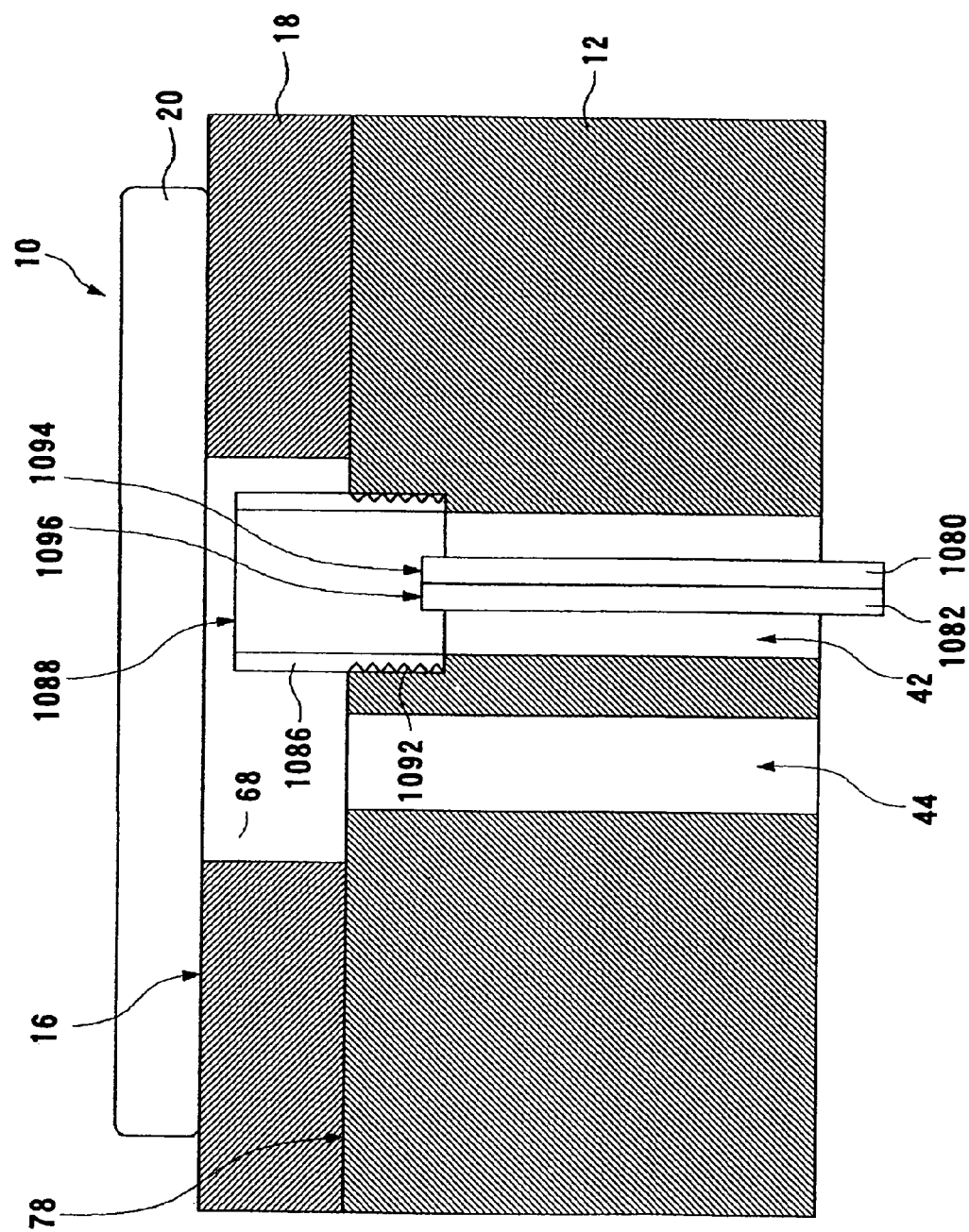

F I G. 17A
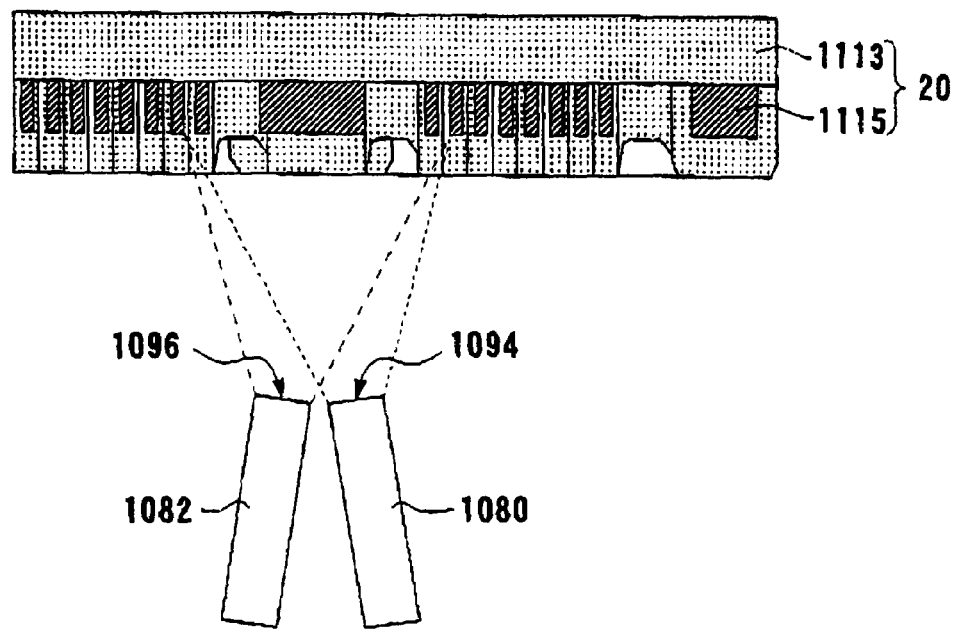
F I G. 17B
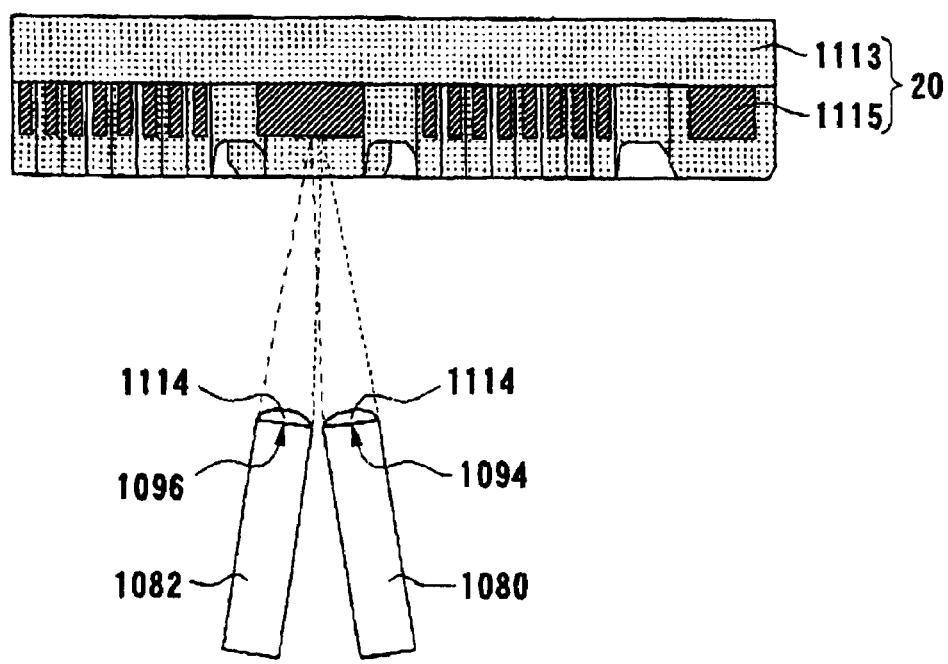

F I G. 2 4
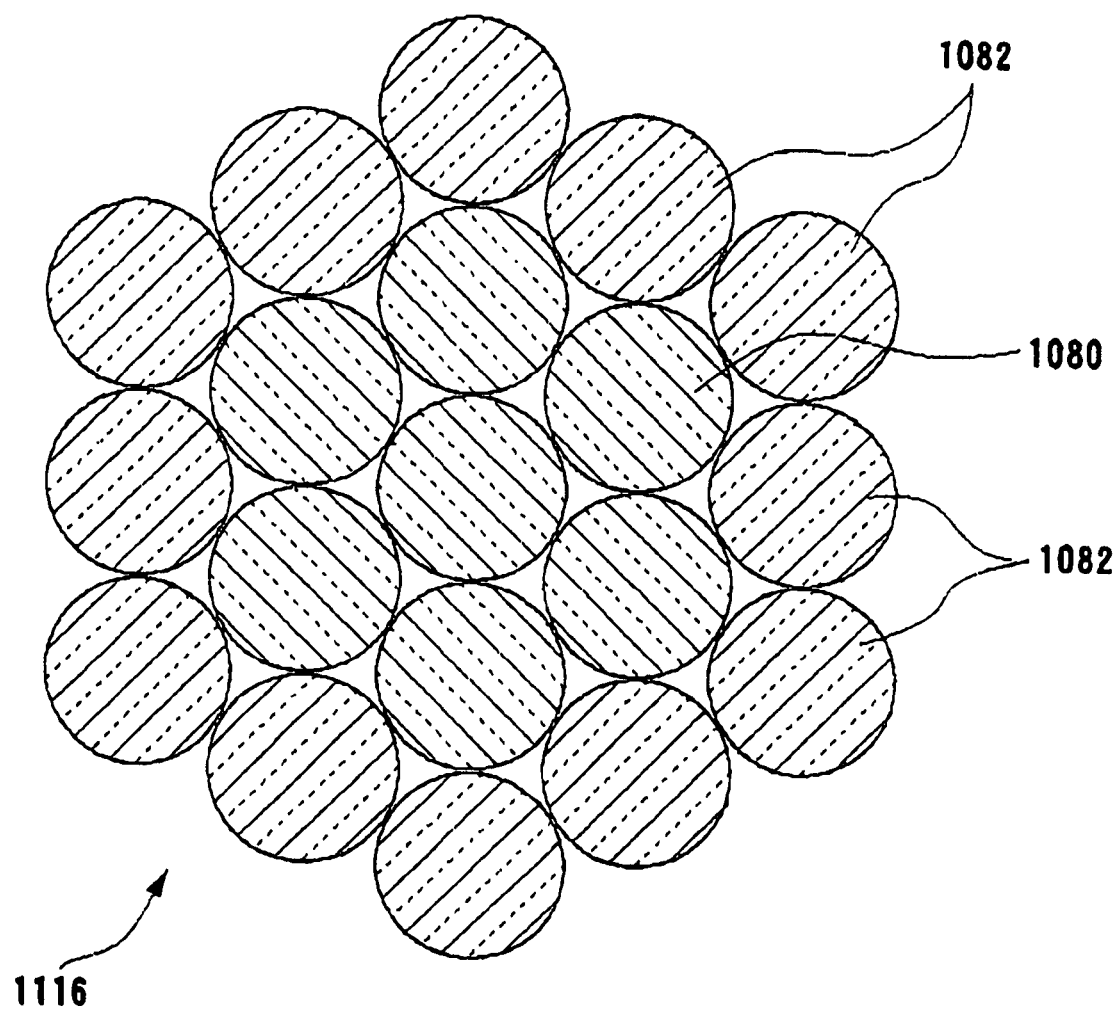

F I G. 2 6
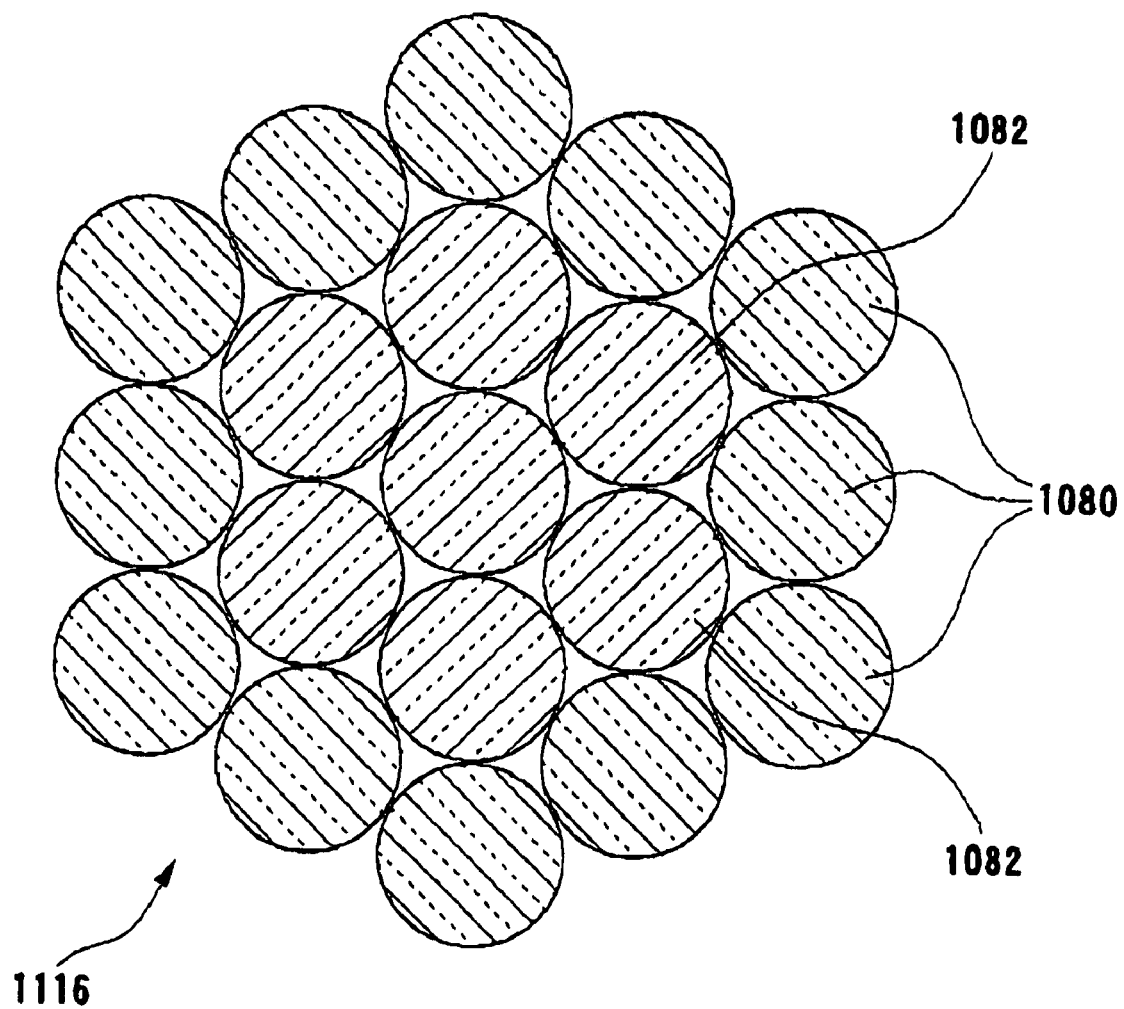

SUBSTRATE POLISHING APPARATUS

BACKGROUND OF THE INVENTION

1. Field of the Invention

The present invention relates to a substrate polishing apparatus having a substrate measuring device utilizing light, and more particularly to a substrate polishing apparatus capable of reducing influence on a polishing process from substrate measurement and improving measurement accuracy of a substrate measuring device.

2. Description of the Related Art

In a semiconductor fabrication process, a substrate polishing apparatus is used to polish a surface of a substrate such as a semiconductor wafer to a flat mirror finish. The substrate polishing apparatus has a polishing table, and a substrate is pressed against a polishing surface on the polishing table. Then, while a polishing abrasive is supplied onto the polishing surface, the polishing table is rotated to polish the substrate. There has been proposed a substrate measuring device utilizing light as a device for measuring a film on a substrate during polishing the substrate. For example, a film thickness can be measured to determine an end point of polishing based on the measured film thickness.

There has been proposed a stream-type device as this type of substrate measuring device. For example, Japanese laid-open patent publication No. 2001-235311 (Patent Document No. 1) discloses a substrate measuring device having a water supply passage provided in a polishing table. An outlet of the water supply passage is provided in the polishing surface, and pure water is ejected through the water supply passage to the substrate. Two optical fibers are disposed in a stream. Measurement light is emitted through one of the optical fibers to the substrate, and reflected light is received through the other of the optical fibers from the substrate. Then, the film thickness is calculated based on the reflected light.

The stream-type substrate measuring device supplies water into a through-hole formed in a polishing pad, so that slurry flowing into the through-hole between the polishing table and the substrate can be diluted, and that slurry attached to the substrate can be cleaned. Thus, influence on measurement from the slurry is reduced so as to maintain a required capability of measurement.

However, a large amount of water should be supplied in order to maintain a required capability of measurement. If water for measurement flows from the through-hole to a surface (polishing surface) of the polishing pad, then slurry is diluted. Dilution of the slurry may have an influence on the polishing performance.

The outflow of water will be described in greater detail. When the water supply passage is covered with the substrate, the amount of outflow of water is relatively small. However, in most of conventionally proposed substrate polishing apparatuses, a location of a substrate is positioned away from a rotational center of the polishing table, and the water supply passage is not covered with the substrate continuously. Specifically, according to the rotation of the polishing table, there alternately appear periods of time during which the water supply passage is covered with the substrate and periods of time during which the water supply passage is not covered with the substrate. During a period of time during which the water supply passage is not covered with the substrate, the amount of outflow of water is increased, thereby diluting the slurry so as to influence the polishing performance.

In the aforementioned substrate polishing apparatus, an opening is formed in the polishing surface to apply the measurement light to the substrate, as described above. The opening formed in the polishing surface should preferably be as small as possible so as to reduce the influence on the polishing process. In order to reduce the size of the opening, it is required to reduce a space for receiving the optical fibers. Under these circumstances, optical fibers having a small diameter have been used for film thickness measurement in a substrate polishing apparatus.

However, optical fibers having a small diameter emit and receive a small amount of light. Therefore, there has been desired a substrate polishing apparatus having an improved ratio of the amount of measurement light emitted to the amount of received light (light-receiving efficiency).

SUMMARY OF THE INVENTION

The present invention has been made in view of the above background. It is, therefore, an object of the present invention to provide a substrate polishing apparatus which can reduce influence on a polishing performance from a fluid for measurement and enhance a light-receiving efficiency of measurement light.

In order to achieve the above object, according to a first aspect of the present invention, there is provided a substrate polishing apparatus characterized by comprising a polishing table against which a substrate is pressed; a light-emitting and light-receiving device to emit measurement light from the polishing table to the substrate and to receive reflected light from the substrate for measuring a film on the substrate; a fluid supply passage for supplying a fluid for measurement to a fluid chamber provided at a light-emitting and light-receiving position of the polishing table, the measurement light and the reflected light passing through the fluid for measurement; and a fluid supply control device for controlling supply of the fluid for measurement to the fluid chamber.

According to the present invention, since supply of the fluid for measurement to the fluid chamber is controlled, fluid supply can be restricted within a range in which a measuring capability can be maintained. Therefore, an outflow of the fluid for measurement can be reduced, and influence on a polishing performance from the fluid for measurement can be reduced.

According to a preferred aspect of the present invention, the fluid supply control device controls supply of the fluid for measurement to the fluid chamber according to a positional relationship between the fluid chamber and the substrate.

According to the present invention, supply of the fluid for measurement is controlled according to the positional relationship between the fluid chamber and the substrate, so that fluid supply can be restricted within a range in which a measuring capability can be maintained. Therefore, an outflow of the fluid for measurement can be reduced, and influence on a polishing performance from the fluid for measurement can be reduced.

According to the present invention, for example, the fluid chamber is formed by a through-hole defined in a polishing pad on the polishing table. However, the fluid chamber is not limited thereto. Any fluid chamber may be used as long as it includes a space of an outlet portion of the fluid supply passage. Therefore, it is not necessary to clarify a boundary between the fluid chamber and the fluid supply passage. The fluid chamber may be formed by a region near an end of the fluid supply passage.

According to a preferred aspect of the present invention, the fluid supply control device ejects the fluid for measurement to the fluid chamber during a blocking period during which the fluid chamber is blocked by the substrate.

The blocking period is defined as a period during which the fluid chamber faces the substrate and during which measurement is performed. Since the fluid chamber is blocked by the substrate during the blocking period, the amount of outflow from the fluid chamber is small even if the fluid for measurement is ejected. Therefore, the substrate can be measured while a large amount of fluid for measurement is supplied with the amount of outflow being reduced.

Within the present invention, during any periods other than the blocking period, supply of the fluid for measurement may be stopped to stop the outflow of the fluid for measurement. However, supply at a low flow rate may be performed as follows.

According to a preferred aspect of the present invention, during an unblocking period during which the fluid chamber is not blocked by the substrate, the fluid supply control device supplies the fluid for measurement to the fluid chamber at a flow rate lower than a flow rate during ejection.

According to the present invention, since a fluid is supplied to the fluid chamber at a low flow rate during the unblocking period, slurry is prevented from entering the fluid chamber during the unblocking period. Therefore, in an arrangement in which a fiber for measurement is provided, slurry is prevented from attaching to a surface of the fiber for measurement, and particularly to an end of the fiber.

According to a preferred aspect of the present invention, the substrate polishing apparatus comprises a compulsory discharge control device for controlling compulsory discharge of a fluid in the fluid chamber according to the positional relationship between the fluid chamber and the substrate.

According to the present invention, since compulsory discharge of the fluid in the fluid chamber is controlled according to the positional relationship between the fluid chamber and the substrate, compulsory discharge can be performed within a range in which a measuring capability can be maintained. Therefore, an outflow of the fluid for measurement can be reduced, and influence on a polishing performance from the fluid for measurement can be reduced.

According to a preferred aspect of the present invention, the compulsory discharge control device compulsorily discharges the fluid in the fluid chamber during a blocking period during which the fluid chamber is blocked by the substrate.

According to the present invention, a large amount of fluid in the fluid chamber, which is supplied to the fluid chamber, can be compulsorily discharged during the blocking period to reduce the amount of outflow of the fluid for measurement.

According to a preferred aspect of the present invention, the compulsory discharge control device continues compulsory discharge of the fluid in the fluid chamber during a predetermined post-blocking period after the blocking period is completed.

According to the present invention, compulsory discharge is continued during a post-blocking period after the blocking period is completed, so that the amount of outflow of the fluid for measurement can be reduced during the post-blocking period.

According to a preferred aspect of the present invention, the compulsory discharge control device restricts compulsory discharge of the fluid in the fluid chamber during a predetermined pre-blocking period before the fluid chamber is blocked by the substrate.

According to the present invention, since compulsory discharge is restricted during the pre-blocking period, the amount of fluid for measurement in the fluid chamber can be increased during the pre-blocking period to substantially fill the fluid with the fluid for measurement. Preferably, the fluid chamber is filled with the fluid for measurement by fluid supply at a low flow rate. Thus, it is possible to reduce the amount of slurry flowing into the fluid chamber when the fluid chamber reaches slurry pools (in which slurry accumulates) immediately before the fluid chamber is moved below the substrate on the polishing table. Reduction of the amount of slurry flowing into the fluid chamber when the fluid chamber passes through the slurry pools can improve the measuring performance when the fluid chamber passes across the substrate.

The sizes of slurry pools differ according to the specifications of the slurry, the polishing pad, and the like. The slurry pools may not be produced in some cases. In such a case, according to the present embodiment, before the fluid chamber has been blocked by the substrate, the amount of fluid in the fluid chamber is increased to improve the measuring performance. For example, it is possible to reduce bubbles involved when the fluid chamber moves below the substrate.

According to a second aspect of the present invention, there is provided a substrate polishing apparatus characterized by comprising a polishing table against which a substrate is pressed; a light-emitting and light-receiving device to emit light from the polishing table to the substrate and to receive reflected light from the substrate; a first passage for ejection, the first passage introducing a fluid, through which the light and the reflected light pass, to a fluid chamber provided at a light-emitting and light-receiving position of the polishing table; a second passage for a low flow rate, the second passage being restricted as compared to the first passage for ejection which introduces the fluid to the fluid chamber; and a switching device for switching the first and second passages into which the fluid is introduced.

According to the present invention, the first passage for ejection and the second passage for a low flow rate are switched. When ejection and low-flow-rate supply is switched, it is possible to obtain the above advantages of the present invention.

According to a third aspect of the present invention, there is provided a substrate polishing apparatus characterized by comprising a polishing table having a polishing surface against which a substrate is pressed; and a passage to supply a fluid to the polishing surface on the polishing table, wherein the passage includes a passage for a high flow rate and a passage for a low flow rate. According to the present invention, with passages for a high flow rate and for a low flow rate, the flow rate can suitably be controlled.

According to a preferred aspect of the present invention, the substrate polishing apparatus comprises a polishing table against which a substrate is pressed; a light-emitting and light-receiving device to emit measurement light from the polishing table to the substrate and to receive reflected light from the substrate for measuring a film on the substrate; a fluid supply passage for supplying a fluid for measurement to a fluid chamber provided at a light-emitting and light-receiving position of the polishing table, the measurement light and the reflected light passing through the fluid for measurement; a fluid supply control device for controlling supply of the fluid for measurement to the fluid chamber and switching an ejection mode in which the fluid for measurement is ejected and a low-flow-rate mode in which a flow rate is lower than that in the ejection mode; and a compulsory discharge control device for controlling compulsory discharge of a fluid in the fluid chamber. During the blocking period during which the fluid chamber is blocked by the substrate, the fluid supply control device sets the ejection mode, and the compulsory discharge control device compulsorily discharges the fluid in the fluid chamber (measurement chamber). During a predetermined pre-blocking period before the fluid chamber is blocked by the substrate, the fluid supply control device sets the low-flow-rate mode, and the compulsory discharge control device restricts compulsory discharge of the fluid in the measurement chamber. During a predetermined post-blocking period after blocking of the fluid chamber by the substrate is completed, the fluid supply control device sets the low-flow-rate mode, and the compulsory discharge control device compulsorily discharges the fluid in the measurement chamber.

According to the present invention, compulsory discharge is performed together with ejection of the fluid during the blocking period. Therefore, measurement can be performed with a sufficient amount of fluid for measurement while the amount of outflow is reduced. Further, during the pre-blocking period, supply at a low flow rate is performed, and compulsory discharge is restricted. Therefore, the amount of fluid for measurement in the fluid chamber can be increased during the pre-blocking period, and it is possible to reduce the amount of slurry flowing into the fluid chamber when the measurement chamber passes through slurry pools immediately before the measurement chamber is moved below the substrate. Further, during the post-blocking period, supply at a low flow rate is performed, and compulsory discharge is performed. Therefore, slurry is prevented from entering the fluid chamber while the amount of outflow is reduced. Thus, according to the present invention, the amount of outflow of the fluid for measurement is reduced while maintaining a measuring capability, and influence on a polishing performance be reduced.

According to a preferred aspect of the present invention, after the polishing process, the fluid supply control device sets the low-flow-rate mode, and the compulsory discharge control device restricts compulsory discharge of the fluid chamber.

According to the present invention, after the polishing process, supply at a low flow rate is performed, and compulsory discharge is restricted. Therefore, it is possible to maintain a state in which the fluid for measurement is present in the fluid chamber.

According to a fourth aspect of the present invention, there is provided a substrate polishing apparatus characterized by comprising a polishing table having a polishing surface for polishing a semiconductor substrate; a light-emitting optical fiber which emits measurement light for measuring a film of the semiconductor substrate through an opening provided in the polishing surface to the semiconductor substrate; and a light-receiving optical fiber which receives the measurement light reflected from the semiconductor substrate, wherein an emitting end of the light-emitting optical fiber and an incident end of the light-receiving optical fiber are located adjacent to each other, and a distance from the light-emitting optical fiber and the light-receiving optical fiber to the semiconductor substrate is determined based on an angle of divergence of the light-emitting optical fiber and an angle of divergence of the light-receiving optical fiber.

According to the present invention, with an arrangement in which the emitting end of the light-emitting optical fiber and the incident end of the light-receiving optical fiber are located adjacent to each other, a path of the measurement light emitted from the light-emitting optical fiber and entering the light-receiving optical fiber is brought closer to being perpendicular to the substrate. Accordingly, it is possible to increase the quantity of light received by the light-receiving optical fiber.

Generally, in order to enhance a light-receiving efficiency of reflected light from a substrate, it is desirable that a distance from the emitting end of the light-emitting optical fiber and the incident end of the light-receiving optical fiber to the substrate is short. However, when the emitting end of the light-emitting optical fiber and the incident end of the light-receiving optical fiber are brought close to the substrate, an effective application area is reduced on the substrate. "Effective application area" is a range to which measurement light that can reach a light-receiving optical fiber through reflection is applied. According to the present invention, attention is drawn to the fact that an effective application area is influenced by an angle of divergence, which is one of characteristics of an optical fiber. A distance from the light-emitting optical fiber and the light-receiving optical fiber to the substrate is determined based on angles of divergence. Thus, a light-receiving efficiency of measurement light can be enhanced. "Angle of divergence" is a maximum angle at which an optical fiber can receive light, and is specified by an NA value, which is one of parameters representing characteristics of an optical fiber.

According to a preferred aspect of the present invention, the distance from the light-emitting optical fiber and the light-receiving optical fiber to the semiconductor substrate is determined based on a value L calculated by $$L=(1-N^2)^{1/2}\times(2T+C)/2N$$

where N is a NA value of the light-emitting optical fiber and the light-receiving optical fiber, C is a core diameter, and T is a thickness of a clad.

The value L calculated by the above formula represents a distance by which a light-emitting optical fiber and a light-receiving optical fiber can be brought close to a substrate without reducing an effective application area. Therefore, when the distance is set based on the calculated value L, a light-receiving efficiency can be improved.

According to a preferred aspect of the present invention, the substrate polishing apparatus comprises light-emitting and light-receiving condensation means for condensing measurement light emitted by the light-emitting optical fiber to the semiconductor substrate, and condensing measurement light reflected from the semiconductor substrate to the light-receiving optical fiber, the light-emitting and light-receiving condensation means being provided so as to cover the emitting end of the light-emitting optical fiber and the incident end of the light-receiving optical fiber.

According to a preferred aspect of the present invention, one of the light-emitting optical fiber and the light-receiving optical fiber is surrounded by the other of the light-emitting optical fiber and the light-receiving optical fiber.

According to a fifth aspect of the present invention, there is provided a substrate polishing apparatus characterized by comprising a polishing table having a polishing surface for polishing a semiconductor substrate; a light-emitting optical fiber which emits measurement light for measuring a film of the semiconductor substrate through an opening provided in the polishing surface to the semiconductor substrate; and a light-receiving optical fiber which receives the measurement light reflected from the semiconductor substrate, wherein an optical axis of the light-emitting optical fiber and an optical axis of the light-receiving optical fiber are inclined with respect to each other.

Strong light is emitted from the optical fiber along an optical axis, and the intensity of the emitted light is lowered at a position spaced from the optical axis. With regard to sensitivity of an optical fiber, an optical fiber can receive light entering from a direction along the optical axis more sensitively as compared to light entering from peripheral portions away from the optical axis. According to the present invention, since an optical axis of the light-emitting optical fiber and an optical axis of the light-receiving optical fiber are inclined with respect to each other, it is possible to improve a light-receiving efficiency of reflected light received by the light-receiving optical fiber.

According to a preferred aspect of the present invention, the optical axis of the light-emitting optical fiber and the optical axis of the light-receiving optical fiber are symmetrical with respect to a normal line of the semiconductor substrate.

With an arrangement in which the optical axis of the light-emitting optical fiber and the optical axis of the light-receiving optical fiber are symmetrical with respect to a normal line of the semiconductor substrate, a traveling direction of light reflected from the substrate substantially coincides with the optical axis of the light-receiving optical fiber. Thus, it is possible to improve a light-receiving efficiency of measurement light received by the light-receiving optical fiber.

According to a preferred aspect of the present invention, the substrate polishing apparatus comprises a polishing table having a polishing surface for polishing a semiconductor substrate; a light-emitting optical fiber which emits measurement light for measuring a film of the semiconductor substrate through an opening provided in the polishing surface to the semiconductor substrate; a light-receiving optical fiber which receives the measurement light reflected from the semiconductor substrate; and light-emitting condensing means provided at an emitting end of the light-emitting optical fiber for condensing measurement light emitted from the light-emitting optical fiber to the semiconductor substrate.

According to the present invention, measurement light can be condensed to the substrate by the light-emitting condensing means, and a light-emitting range can be reduced. Accordingly, it is possible to reduce influence on film measurement of a pattern on a substrate. It is desirable that a range to which measurement light is emitted is reduced so that irregularities of the pattern on the substrate have no influence on the film measurement. The light-emitting condensing means may be formed by attaching a lens to an emitting end or lens-processing an emitting end.

According to a preferred aspect of the present invention, the substrate polishing apparatus comprises a polishing table having a polishing surface for polishing a semiconductor substrate; a light-emitting optical fiber which emits measurement light for measuring a film of the semiconductor substrate through an opening provided in the polishing surface to the semiconductor substrate; a light-receiving optical fiber which receives the measurement light reflected from the semiconductor substrate; and light-receiving condensing means provided at an incident end of the light-receiving optical fiber for condensing measurement light reflected from the semiconductor substrate to the light-receiving optical fiber.

With this arrangement, light can be focused at a predetermined point on the substrate, and light reflected from the point can be condensed. Thus, noise components can be reduced to improve an S/N ratio of measurement light. The light-receiving condensing means may be formed by attaching a lens to an incident end or lens-processing an incident end.

According to a preferred aspect of the present invention, the substrate polishing apparatus comprises a polishing table having a polishing surface for polishing a semiconductor substrate; a light-emitting optical fiber which emits measurement light for measuring a film of the semiconductor substrate through an opening provided in the polishing surface to the semiconductor substrate; a light-receiving optical fiber which receives the measurement light reflected from the semiconductor substrate; and light-emitting and light-receiving condensation means for condensing measurement light emitted by the light-emitting optical fiber to the semiconductor substrate, and condensing measurement light reflected from the semiconductor substrate to the light-receiving optical fiber, the light-emitting and light-receiving condensation means being provided so as to cover an emitting end of the light-emitting optical fiber and an incident end of the light-receiving optical fiber.

According to the present invention, since one light-emitting and light-receiving condensation means performs condensation of measurement light to the substrate and condensation of reflected light from the substrate, a focal point of measurement light emitted from the light-emitting optical fiber and a focal point of measurement light received by the light-receiving optical fiber coincide with each other. Accordingly, emitted measurement light can be condensed to the substrate, and light reflected from a condensed point can be condensed to the light-receiving optical fiber. Thus, it is possible to improve an S/N ratio of measurement light. The light-emitting and light-receiving condensation means may be formed by attaching a lens covering the emitting end and the incident end to the emitting end and the incident end or lens-processing the emitting end and the incident end.

According to a sixth aspect of the present invention, there is provided a substrate polishing apparatus characterized by comprising a polishing table having a polishing surface for polishing a semiconductor substrate; and an optical fiber member for emitting measurement light for measuring a film of the semiconductor substrate through an opening provided in the polishing surface to the semiconductor substrate and for receiving the measurement light reflected from the semiconductor substrate, wherein the optical fiber member includes at least one light-emitting optical fiber and at least one light-receiving optical fiber, and one of the at least one light-emitting optical fiber and the at least one light-receiving optical fiber is surrounded by the other of the at least one light-emitting optical fiber and the at least one light-receiving optical fiber.

With this arrangement, it is possible to increase a light-receiving ratio of measurement light reflected from the substrate and improve an S/N ratio of measurement light.

According to a preferred aspect of the present invention, one of the at least one light-emitting optical fiber and the at least one light-receiving optical fiber covers the other of the at least one light-emitting optical fiber and the at least one light-receiving optical fiber.

With an arrangement in which one of the light-emitting optical fiber and the light-receiving optical fiber covers the other of the light-emitting optical fiber and the light-receiving optical fiber, a clad common to both optical fibers can be formed between the light-emitting optical fiber and the light-receiving optical fiber. With a common clad, it is possible to reduce an interval between a core of the light-emitting optical fiber and a core of the light-receiving optical fiber. Thus, it is possible to increase a ratio of light received by the light-receiving optical fiber to light reflected from the substrate.

According to a preferred aspect of the present invention, the optical fiber member includes a light-emitting optical fiber and a plurality of light-receiving optical fibers which surrounds the light-emitting optical fiber.

Since measurement light is emitted from a light-emitting optical fiber, a range to which measurement light is applied can be restricted.

According to a preferred aspect of the present invention, the optical fiber member includes a light-receiving optical fiber and a plurality of light-emitting optical fibers which surrounds the light-receiving optical fiber.

According to the present invention, since the light-receiving optical fiber is surrounded by a plurality of light-emitting optical fibers, the light-receiving optical fiber can efficiently receive measurement light emitted from the light-emitting optical fibers.

According to a seventh aspect of the present invention, there is provided a substrate polishing apparatus characterized by comprising a polishing table having a polishing surface for polishing a semiconductor substrate; and an optical fiber member for emitting measurement light for measuring a film of the semiconductor substrate through an opening provided in the polishing surface to the semiconductor substrate and for receiving the measurement light reflected from the semiconductor substrate, wherein the optical fiber member includes a plurality of light-emitting optical fibers and a plurality of light-receiving optical fibers, and the light-emitting optical fibers and the light-receiving optical fibers are bundled together.

With this arrangement, it is possible to increase a light-receiving ratio of measurement light reflected from the substrate and improve an S/N ratio of measurement light.

According to a preferred aspect of the present invention, the optical fiber member is arranged such that a plurality of light-emitting optical fibers is surrounded by a plurality of light-receiving optical fibers.

By concentrating light-emitting optical fibers at the center of the optical fiber member, a range to which measurement light is applied can be restricted.

According to a preferred aspect of the present invention, the optical fiber member is arranged such that a plurality of light-receiving optical fibers is surrounded by a plurality of light-emitting optical fibers.

According to the present invention, since the light-receiving optical fibers are surrounded by the plurality of light-emitting optical fibers, the light-receiving optical fibers can efficiently receive measurement light emitted from the light-emitting optical fibers.

According to an eighth aspect of the present invention, there is provided a substrate polishing apparatus characterized by comprising a polishing table having a polishing surface for polishing a semiconductor substrate; and an optical fiber member for emitting measurement light for measuring a film of the semiconductor substrate through an opening provided in the polishing surface to the semiconductor substrate and for receiving the measurement light reflected from the semiconductor substrate, wherein the optical fiber member comprises a composite optical fiber having divided cross-sections including a region of a light-emitting optical fiber and a region of a light-receiving optical fiber.

With an arrangement having a region of a light-emitting optical fiber and a region of a light-receiving optical fiber, a clad common to both optical fibers can be formed between the respective regions. With a common clad, it is possible to reduce intervals between a core of the light-emitting optical fiber region and a core of the light-receiving optical fiber region. Thus, it is possible to enlarge an overlapping area an application area of measurement light emitted from the light-emitting optical fiber and a light-receivable area by the light-receiving optical fiber.

Although various aspects of the present invention have been described above, the present invention is not limited to the above substrate polishing apparatus. For example, according to another aspect of the present invention, there is provided a substrate measuring device provided in the above substrate polishing apparatus. Further, according to another aspect of the present invention, there is provided a substrate polishing method with the above substrate polishing apparatus and a substrate measuring method with the substrate measuring device.

BRIEF DESCRIPTION OF THE DRAWINGS

FIG. 8 is a diagram showing changes of the amount of fluid in the through-hole of the polishing table under the control shown in FIG. 7.

FIG. 9 is a diagram showing an arrangement of a substrate polishing apparatus according to a second embodiment of the present invention.

FIGS. 17A and 17B are schematic diagrams showing a surface of a substrate to be polished in an enlarged manner.

FIG. 24 is a cross-sectional view of light-emitting optical fibers and light-receiving optical fibers which are used in an eighth embodiment of the present invention.

FIG. 26 is a cross-sectional view of light-emitting optical fibers and light-receiving optical fibers which are used in a variation of the eighth embodiment.

DETAILED DESCRIPTION OF THE PREFERRED EMBODIMENTS

Embodiments of the present invention will be described below with reference to the drawings.

Figure 1:
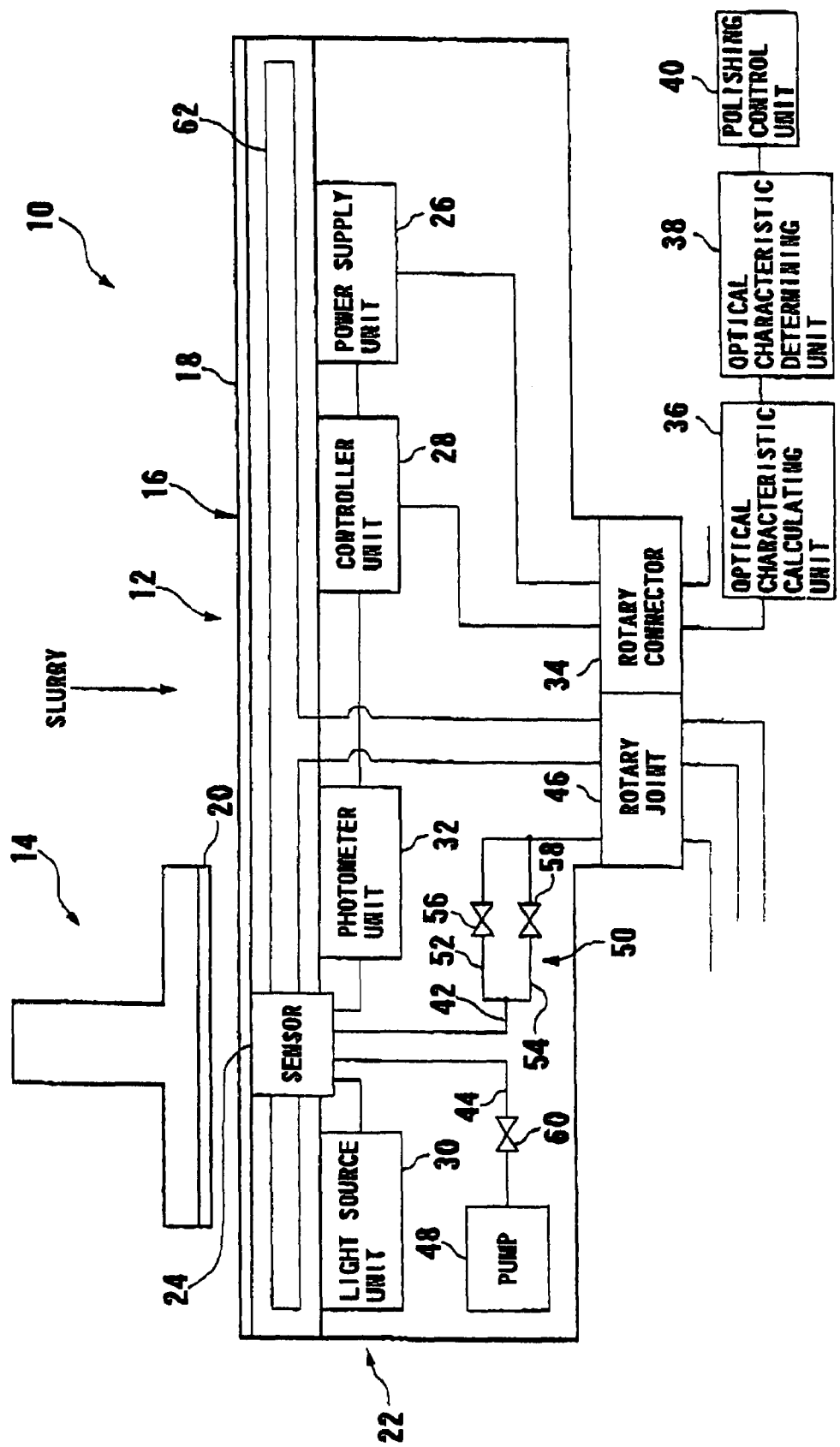
FIG. 1 is a diagram showing a substrate polishing apparatus according to a first embodiment of the present invention.

FIG. 1 shows a substrate polishing apparatus according to a first embodiment of the present invention. The substrate polishing apparatus 10 is a so-called chemical mechanical polishing (CMP) apparatus and has a polishing table 12 and a top ring 14. A polishing pad 18, which has a polishing surface 16 thereon, is mounted on the polishing table 12. The top ring 14 supports a substrate 20 on a lower surface thereof and is rotated together with the substrate 20. The top ring 14 presses the substrate 20 against the polishing pad 18 at a location away from a center of the polishing table 12. Slurry for polishing is supplied between the polishing pad 18 and the substrate 20. The substrate 20 is rotated in the presence of the slurry in a state such that the substrate 20 is pressed against the polishing pad 18 on the polishing table 12. Further, the polishing table 12 is rotated. The substrate 20 is thus polished. As the polishing pad 18, a fixed abrasive type polishing pad which is formed by fixing polishing abrasive particles by a binder agent such as epoxy may be used in addition to a polishing cloth made of polyurethane foam, a nonwoven fabric type polishing cloth, and a suede type polishing cloth.

The substrate polishing apparatus 10 is used to polish a thin film formed on the substrate 20. Polishing is completed when the thickness of the thin film becomes a predetermined value. In the present embodiment, determination of completion is referred to as end point detection. The substrate polishing apparatus 10 has a film thickness measuring device 22, which will be described below, for end point detection.

The film thickness measuring device 22 is an example of a substrate measuring device according to the present invention. For example, a film to be measured is a silicon oxide film. The film thickness measuring device 22 has a sensor 24 mounted in the polishing table (rotatable table) 12, and also has a power supply unit 26, a controller unit 28, a light source unit 30, and a photometer unit 32, which are mounted on a lower surface of the polishing table 12.

The power supply unit 26 receives electric power via a rotary connector 34 and supplies the electric power to the respective units in the film thickness measuring device 22. The controller unit 28 controls the entire system of the film thickness measuring device 22. The light source unit 30 supplies measurement light to the sensor 24, and the measurement light is applied to the substrate 20 through the sensor 24. The sensor 24 receives reflected light from the substrate 20 and transmits it to the photometer unit 32. Members for transmitting the measurement light and the reflected light comprise optical fibers. In the photometer unit 32, light signals are converted into electric signals. The electric signals are processed in the controller unit 28.

The controller unit 28 is connected to an optical characteristic calculating unit 36 via the rotary connector 34, and the optical characteristic calculating unit 36 is connected to an optical characteristic determining unit 38. The signals processed in the controller unit 28 are transmitted to the optical characteristic calculating unit 36, which calculates optical characteristics such as the film thickness, the reflection intensity, and the spectrum. The optical characteristic determining unit 38 determines the optical characteristics such as the film thickness and performs end point detection to determine whether or not the film thickness reaches a predetermined value. The determined results are sent to a polishing control unit 40, which controls the entire system of the substrate polishing apparatus 10.

The film thickness measuring device 22 also has a supply passage 42 to supply a fluid for measurement to the sensor 24, and a discharge passage 44 to discharge the fluid for measurement from the sensor 24. The supply passage 42 is connected to a tank, which is not shown, via a rotary joint 46. The discharge passage 44 is connected to a pump 48 for discharging a fluid in a measurement chamber (fluid chamber). The fluid for measurement is discharged by the pump 48, and a polishing liquid such as slurry flowing into the measurement chamber is also discharged.

In the present embodiment, the fluid for measurement is pure water. The pure water may be supplied from a tank provided in a facility such as a plant having a substrate polishing apparatus. The supply passage 42 and the discharge passage 44 are constituted by suitable pipes or the like. For example, by coating the pipes with resin (non-metal material) such as PEEK, it is possible to prevent metal contamination to a substrate. The supply passage 42 and the discharge passage 44 may include jackets provided in the polishing table 12.

As shown in FIG. 1, the supply passage 42 has a parallel section 50, and the parallel section 50 comprises a main passage 52 and a sub passage 54. The main passage 52 and the sub passage 54 have supply control valves 56 and 58. The main passage 52 is used to supply pure water at a high flow rate and eject the pure water in the sensor 24. On the other hand, the sub passage 54 has an orifice (not shown) and is used to supply pure water at a low flow rate. The supply control valves 56 and 58 are opened and closed to switch low-flow-rate supply of pure water and ejection of pure water.

Further, the discharge passage 44 has a discharge control valve 60. The discharge control valve 60 is used to control the timing of compulsory discharge. The discharge control valve 60 and the supply control valves 56, 58 comprise an electromagnetic valve and constitute an electromagnetic valve unit, which is not shown. The electromagnetic valve unit is mounted on a lower surface of the polishing table 12 as with the other units.

The substrate polishing apparatus 10 also has a water jacket 62 provided in the polishing table 12 for cooling. The water jacket 62 is connected to a water tank, which is not shown, through the rotary joint 46.

Figure 2:
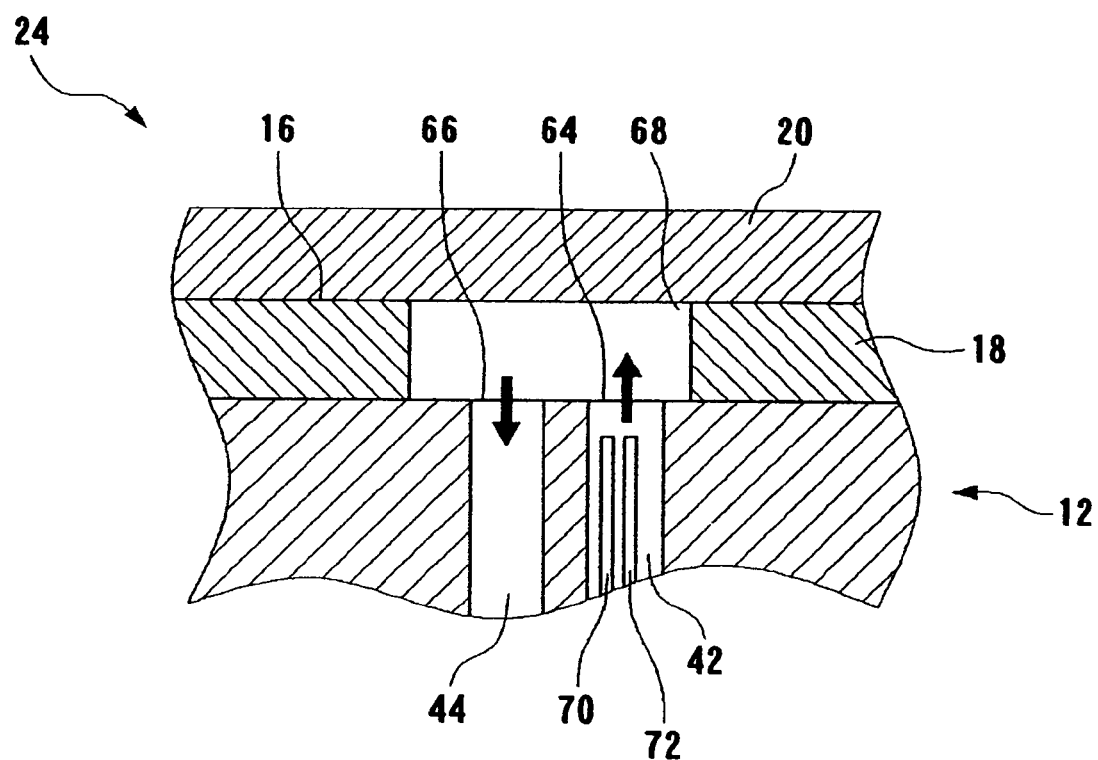
FIG. 2 is a diagram showing an example of an arrangement of a sensor provided in the substrate polishing apparatus shown in FIG. 1.

FIG. 2 shows an example of an arrangement of the sensor 24. As described above, the polishing pad 18 is mounted on the polishing table 12, and the substrate 20 is brought into contact with the polishing pad 18. The supply passage 42 and the discharge passage 44 are provided adjacent to each other in the polishing table 12. A supply port 64 of the supply passage 42 and a discharge port 66 of the discharge passage 44 are positioned on an upper surface of the polishing table 12. The polishing pad 18 has a through-hole 68 so as to expose the supply port 64 and the discharge port 66.

A light-emitting optical fiber 70 and a light-receiving optical fiber 72 are disposed adjacent to each other within the supply passage 42. The light-emitting optical fiber 70 and the light-receiving optical fiber 72 are connected to the light source unit 30 and the photometer unit 32 (FIG. 1). The light-emitting optical fiber 70 applies measurement light, which is supplied from the light source unit 30, to the substrate 20. The light-receiving optical fiber 72 receives reflected light from the substrate 20 and transmits it to the photometer unit 32.

In the sensor 24 described above, a fluid for measurement, such as pure water, is supplied through the supply port 64 and discharged through the discharge port 66. The interior of the through-hole 68 is filled with pure water or the like, so that slurry used for polishing is prevented from entering the through-hole 68. Thus, since the interior of the through-hole 68 is maintained transparent, film measurement using measurement light can satisfactorily be performed.

Figure 3:
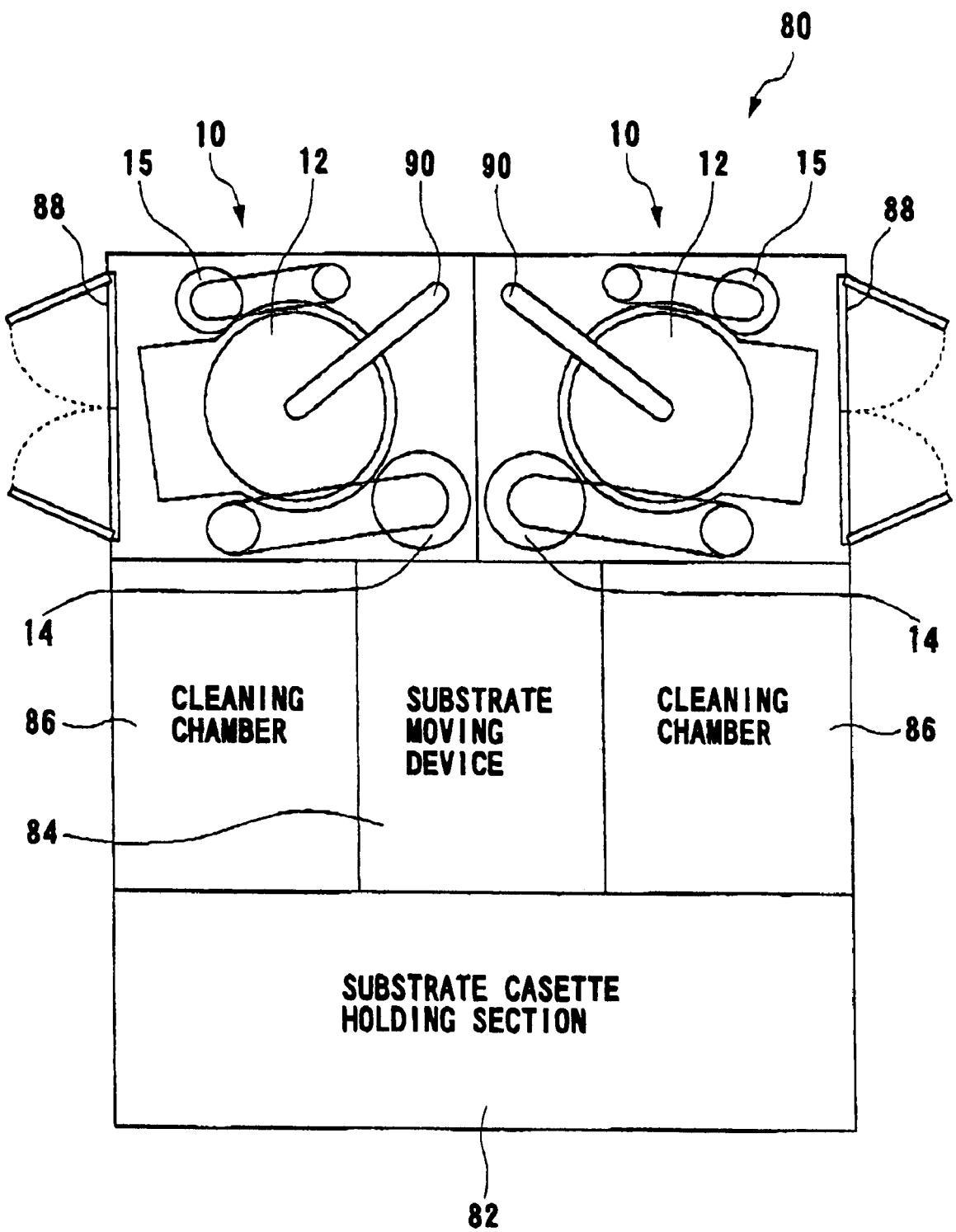
FIG. 3 is a diagram showing a substrate processing apparatus having the substrate polishing apparatus shown in FIG. 1.

FIG. 3 shows an entire arrangement of a substrate processing apparatus 80 having the substrate polishing apparatuses 10. The substrate processing apparatus 80 has a substrate cassette holding section 82, a substrate moving device 84, and cleaning chambers 86 as well as the substrate polishing apparatuses 10. A substrate as a workpiece to be polished is delivered from the substrate cassette holding section 82 to the substrate polishing apparatus 10. A polished substrate is cleaned and dried in the cleaning chamber 86 and returned to the substrate cassette holding section 82.

Further, the substrate processing apparatus 80 has working windows 88 in chambers in which the substrate polishing apparatuses 10 are installed. The substrate polishing apparatus 10 has a top ring 14 for supporting a substrate. A dresser 15 is provided so as to face the top ring 14 with the polishing table 12 being interposed between the dresser 15 and the top ring 14. Slurry is supplied through a nozzle 90 to the polishing table 12. The nozzle 90 forms a slurry supply pipe, i.e., a slurry supply device, for supplying slurry from a slurry container. A fluid for measurement is supplied to the polishing table 12 from a lower portion of the nozzle, which is not shown.

The entire arrangement of the substrate polishing apparatus 10 in the present embodiment has been described together with the arrangement of the sensor 24. Next, there will be described the features of the arrangement in the present embodiment.

Figure 4:
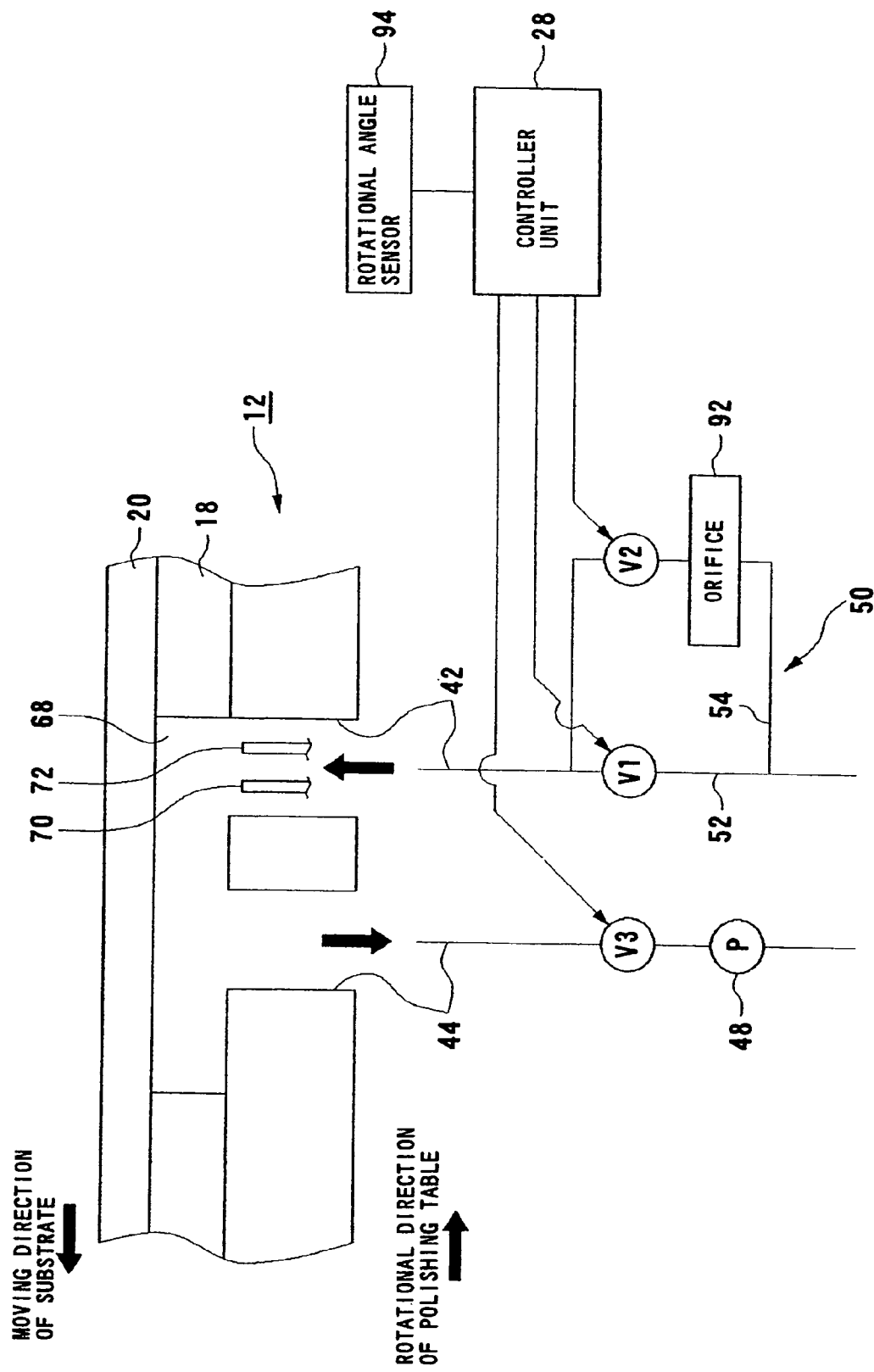
FIG. 4 is a diagram showing an arrangement for control of supply and discharge of a fluid for measurement in the substrate polishing apparatus shown in FIG. 1.

FIG. 4 shows an arrangement with respect to control of supply and discharge of a fluid for measurement, such as pure water. As described above, the through-hole 68 is formed in the polishing pad 18, and the supply passage 42 and the discharge passage 44 communicate with the through-hole 68. The light-emitting optical fiber 70 and the light-receiving optical fiber 72 are disposed within the supply passage 42.

The supply passage 42 has the parallel section 50, and the parallel section 50 comprises the main passage 52 and the sub passage 54. The sub passage 54 has an orifice 92 to restrict the passage. The main passage 52 has an ejection control valve V1, and the sub passage 54 has a low-flow-rate control valve V2. The ejection control valve V1 and the low-flow-rate control valve V2 correspond to the supply control valves 56 and 58 shown in FIG. 1 and form a switching device for the main passage 52 and the sub passage 54.

Pure water delivered from a pipe in a facility having the substrate polishing apparatus 10 is introduced into the supply passage 42. The amount of pure water supplied from the supply passage 42 to the through-hole 68 is set as follows. Specifically, the supply passage 42 is arranged such that a flow rate at the time when the ejection control valve V1 of the main passage 52 is opened and the low-flow-rate control valve V2 of the sub passage 54 is closed is in a range of 50 to 200 cc/min, and that a flow rate at the time when the low-flow-rate control valve V2 is opened and the ejection control valve V1 is closed is 50 cc/min or less. With such an arrangement, pure water is ejected through the main passage 52 to the through-hole 68 and supplied at a low flow rate through the sub passage 54 to the through-hole 68.

On the other hand, a pump 48 is disposed on the discharge passage 44, and a discharge control valve V3 is also disposed on the discharge passage 44. The discharge control valve V3 corresponds to the discharge control valve 60 shown in FIG. 1. The pump 48 comprises a constant amount pump in the present embodiment. The amount of discharged pure water is set to be in a range of ±20% of the amount of ejected pure water. Preferably, the amount of supplied pure water is set to be larger than the amount of discharged pure water to maintain a sufficient amount of water during measurement. The pump 48 is not limited to a constant amount pump within the scope of the present invention, and a constant pressure pump may be applied to the pump 48.

Opening and closing of the ejection control valve V1, the low-flow-rate control valve V2, and the discharge control valve V3 are controlled by the controller unit 28. A rotational angle sensor 94 is connected to the controller unit 28. The rotational angle sensor 94 detects an angular position of the polishing table 12 in a rotational direction. The controller unit 28 controls opening and closing of the ejection control valve V1, the low-flow-rate control valve V2, and the discharge control valve V3 based on detected signals of the rotational angle sensor 94.

The position of the substrate 20 is fixed relative to the polishing table 12. The through-hole 68 is rotated together with the polishing table 12. The use of the angular position of the polishing table 12 allows controller unit 28 to control the ejection control valve V1, the low-flow-rate control valve V2, and the discharge control valve V3 according to the positional relationship between the through-hole 68 and the substrate 20. The rotational angle sensor 94 serves as a sensor or means for detecting a rotational angle of the polishing table 12 so as to detect the positional relationship between the through-hole 68 and the substrate 20.

With the above arrangement, the through-hole 68 corresponds to a fluid chamber according to the present invention. The light-emitting optical fiber 70 and the light-receiving optical fiber 72 form a light-emitting and light-receiving device for emitting and receiving measurement light. The supply passage 42 and the discharge passage 44 serve as a supply device and a discharge device for a fluid for measurement, such as pure water. The ejection control valve V1 and the low-flow-rate control valve V2 form a fluid supply control device together with the controller unit 28, and similarly the discharge control valve V3 forms a fluid discharge control device together with the controller unit 28. Furthermore, the main passage 52 and the sub passage 54 in the supply passage 42 correspond to a passage for ejection and a passage for a low flow rate.

Next, control of supply and discharge by the controller unit 28 will be described with reference to FIGS. 5 through 8.

Figure 5:
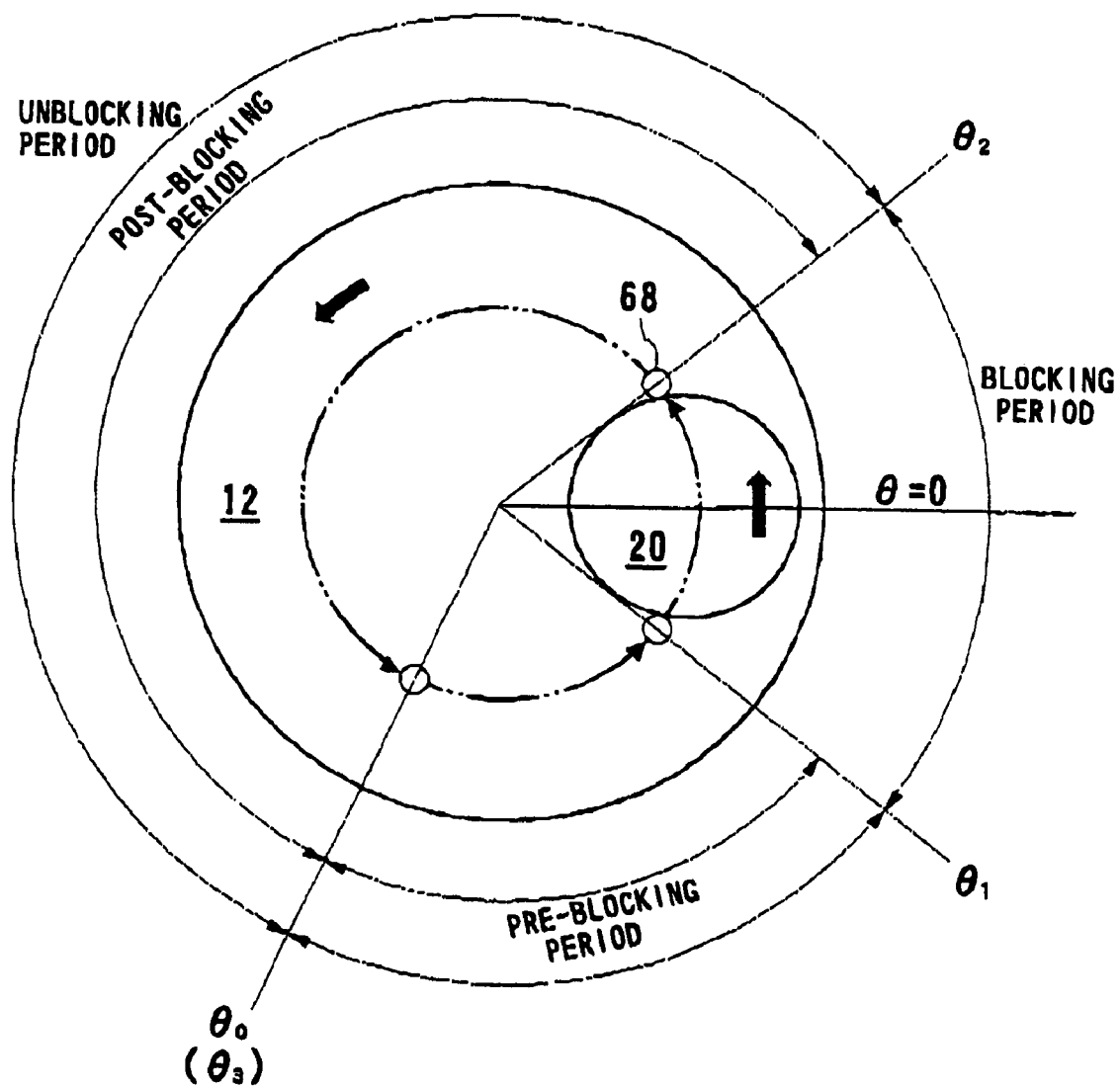
FIG. 5 is a diagram showing a positional relationship between a substrate and a through-hole of a polishing table in the substrate polishing apparatus shown in FIG. 1.

FIG. 5 shows the positional relationship between the through-hole 68 (fluid chamber) and the substrate 20. As described above, the position of the substrate 20 is fixed relative to the polishing table 12, and the through-hole 68 is rotated together with the polishing table 12. Therefore, the positional relationship between the through-hole 68 and the substrate 20 is represented by an angular position θ of the through-hole 68 in a rotational direction. In FIG. 5, when the through-hole 68 is positioned on a line interconnecting the center of the polishing table 12 and the center of the substrate 20, the angular position θ of the through-hole 68 is defined as zero degrees.

In FIG. 5, when θ=θ1, an end of the through-hole 68 reaches the substrate 20, and the through-hole 68 begins to be covered with the substrate 20. When θ=θ2, the through-hole 68 has completely passed across the substrate 20, and the through-hole 68 becomes entirely uncovered with the substrate 20. Therefore, during a period of θ1≦θ≦θ2, the substrate 20 is positioned above the through-hole 68. This period is referred to as a "blocking period" in the present embodiment. During any period other than the blocking period, the through-hole 68 is not blocked by the substrate 20, and this period is referred to as an "unblocking period" as shown in FIG. 5. The "unblocking period" is classified into two periods including a "pre-blocking period" and a "post-blocking period".

The pre-blocking period is defined as a predetermined period before the through-hole 68 is blocked by the substrate 20. In the present embodiment, the pre-blocking period is set as θ0≦θ<θ1. θ0 is set so as to be −120 degrees.

On the other hand, the post-blocking period is defined as a predetermined period after the blocking of the through-hole 68 by the substrate 20 is completed. In FIG. 5, the post-blocking period is defined as θ2<θ<θ3. θ3 is 240 degrees (=360+θ0), and hence a subsequent pre-blocking period starts after the post-blocking period has ended.

More specifically, the blocking period may be set as follows.

Figure 6:
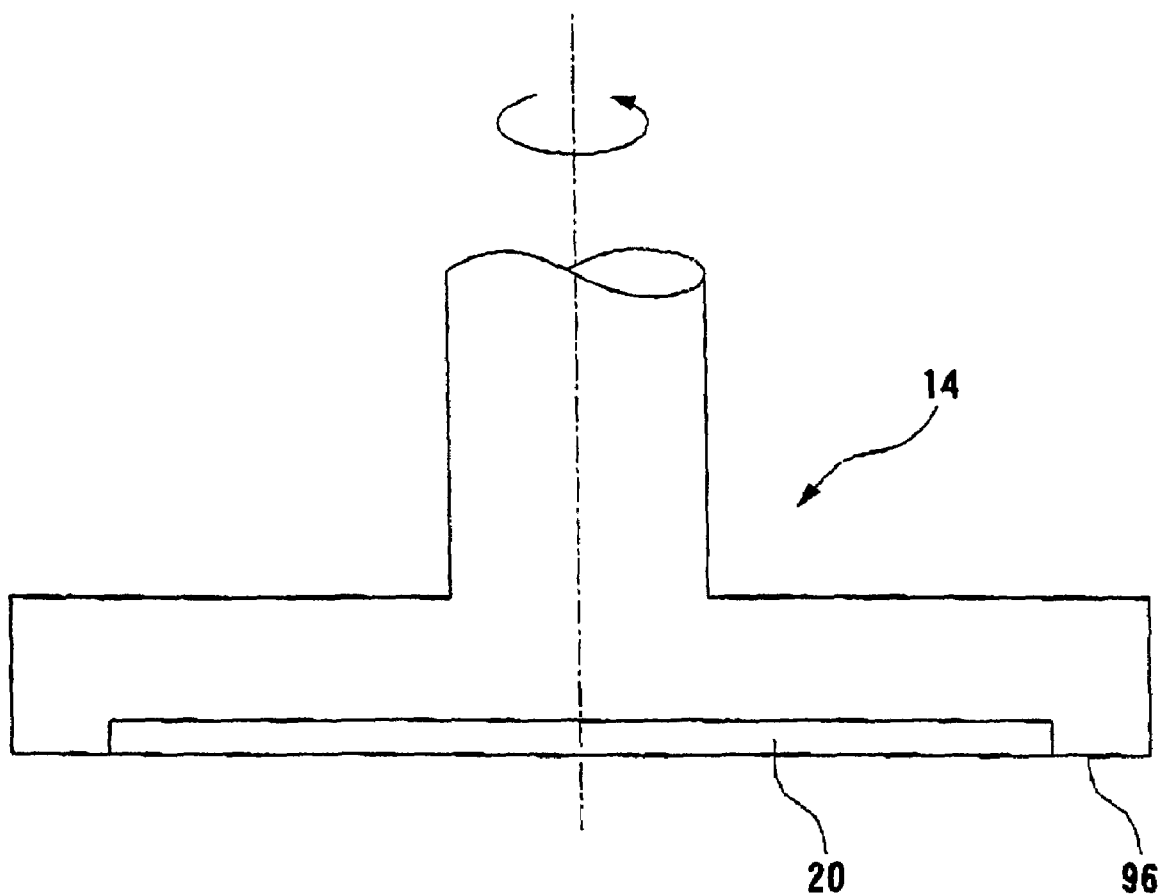
FIG. 6 is a diagram showing an arrangement of a top ring for supporting a substrate.

FIG. 6 shows an arrangement of the top ring 14 for supporting the substrate 20. As shown in FIG. 6, a top ring 14 generally has a guide ring 96 on a supporting surface on which the substrate 20 is mounted. A peripheral portion of the substrate 20 is surrounded by the guide ring 96. In such a case, the "blocking period" may be set as a period during which the through-hole reaches the guide ring 96 and passes across the substrate 20 and away from the guide ring 96 at an opposite side of the substrate 20. According to this setting, the guide ring 96 is regarded as a portion of the substrate 20, and this configuration is included in the scope of the present invention. In other words, the blocking period according to the present invention may be a period from the time when the through-hole reaches the guide ring 96 to the time when the through-hole passes away from the guide ring 96, i.e., a period during which the fluid chamber is blocked by the substrate. This holds true in cases where elements other than the guide ring 96 are disposed around the substrate 20. The blocking period may be set based on overlap of only the substrate 20 with the through-hole without consideration of elements including the guide ring 96.

Figure 7:
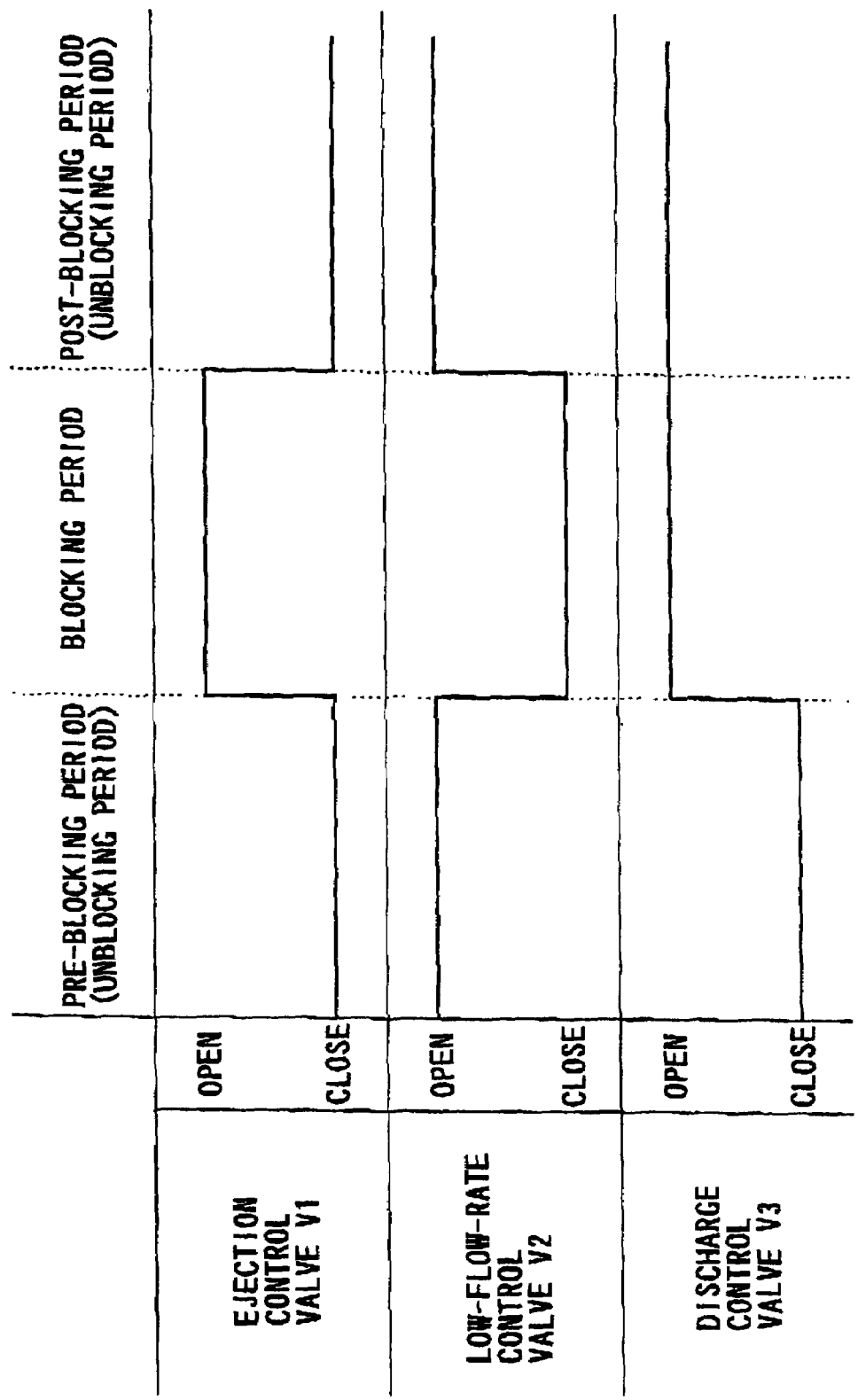
FIG. 7 is a diagram showing control of supply and discharge of the fluid for measurement in the arrangement shown in FIG. 4.

FIG. 7 shows opening and closing control of the ejection control valve V1, the low-flow-rate control valve V2, and the discharge control valve V3 during the respective periods shown in FIG. 5.

During the pre-blocking period, the controller unit 28 sets a low-flow-rate mode. In the low-flow-rate mode, the ejection control valve V1 is closed, and the low-flow-rate control valve V2 is opened in response to a control signal from the controller unit 28. Thus, pure water is supplied through the sub passage 54 at a low flow rate.

Further, during the pre-blocking period, the controller unit 28 controls the discharge control valve V3 to restrict compulsory discharge. In the present embodiment, since the discharge control valve V3 is closed, the compulsory discharge is stopped.

Next, during the blocking period, the controller unit 28 sets an ejection mode. In the ejection mode, the ejection control valve V1 is opened, and the low-flow-rate control valve V2 is closed in response to a control signal from the controller unit 28. Thus, a large amount of pure water is supplied through the main passage 52, and the supplied pure water is ejected into the through-hole 68. Within the scope of the present invention, the low-flow-rate control valve V2 may not be closed. In this case, it is possible to switch low-flow-rate supply and ejection of pure water (hereinafter the same as above).

Further, during the blocking period, the controller unit 28 controls the discharge control valve V3 so as to perform compulsory discharge. The discharge control valve V3 is opened in response to a control signal from the controller unit 28 to perform compulsory discharge by the pump 48.

Next, during the post-blocking period, the controller unit 28 switches from the ejection mode to the low flow rate mode. Therefore, the ejection control valve V1 is closed, and the low-flow-rate control valve V2 is opened to reduce the amount of supplied pure water.

Further, during the post-blocking period, the controller unit 28 continues the compulsory discharge performed during the blocking period. Therefore, the discharge control valve V3 remains opened, and compulsory discharge is performed by the pump 48.

FIG. 8 is a schematic view showing a state of the through-hole 68 during the respective periods described above. First, the blocking period shown at the center of the FIG. 8 will be described. Since pure water is ejected during the blocking period, the through-hole 68 is filled with a large amount of pure water. Slurry in the through-hole 68 is diluted by the pure water. Particularly, pure water immediately after being supplied forms substantially a vertical liquid column above the supply passage 42 to maintain transparency required for measurement. Film thickness measurement is performed during the blocking period. Specifically, measurement light is emitted and reflected light is received within a water column produced by ejection. During the blocking period, the through-hole 68 is blocked by the substrate 20, and the compulsory discharge is performed. Therefore, the amount of pure water flowing out between the substrate 20 and the surface of the polishing pad 18 can be reduced.

Thus, during the blocking period, while the outflow of the pure water is prevented, the transparency can be maintained in the through-hole 68 to achieve a required measurement capability.

Next, during the post-blocking period, pure water is supplied to the through-hole 68 at a low flow rate, and the pure water is compulsorily discharged from the through-hole 68. Therefore, the pure water remains on a portion of the through-hole 68 as schematically shown in FIG. 8. With such a control, dilution of slurry due to the ejection of pure water is prevented, and the slurry is prevented from entering the through-hole 68. Accordingly, slurry is prevented from attaching to surfaces of the fibers for measurement, particularly to ends of the fibers.

In this regard, since measurement is not performed during the post-blocking period, it can be considered that supply of the pure water to the through-hole 68 is completely stopped. However, if slurry excessively enters the through-hole 68, then slurry may remain in the through-hole 68 at the next blocking period to lower the transparency. In order to prevent such a drawback, pure water is supplied at a low flow rate during the post-blocking period in the present embodiment to suitably prevent slurry from entering the through-hole 68.

Next, the pre-blocking period will be described. During the pre-blocking period, the supply of pure water at a low flow rate is continued, and the compulsory discharge is stopped. Thus, the amount of pure water within the through-hole 68 is increased. Since the amount of supplied pure water is small, the amount of pure water flowing out of the through-hole 68 can be reduced.

As described above, the amount of pure water within the through-hole 68 is increased during the pre-blocking period to substantially fill the fluid chamber with the pure water. Preferably, the length of the pre-blocking period is set so that the through-hole 68 is filled with pure water during the pre-blocking period as shown in FIG. 8. With this configuration, the following advantages can be obtained.

Slurry pools are present immediately before the through-hole 68 on the polishing table 12 is moved below the substrate 20. The slurry pools are produced by the fact that slurry to be involved below the substrate 20 accumulates at a periphery of the substrate 20. More specifically, with an arrangement in which the substrate 20 is surrounded by the guide ring 96 (FIG. 6) of the top ring 14, slurry pools are produced at a periphery of the guide ring 96. When the compulsory discharge is performed, the through-hole 68 reaches slurry pools in a state such that the through-hole 68 has voids therein. As a result, a large amount of slurry may flow into the through-hole 68 to lower the measuring performance. However, in the present embodiment, with the aforementioned control, the amount of pure water within the through-hole 68 can be increased before the through-hole 68 reaches slurry pools. Therefore, the amount of slurry flowing into the through-hole 68 when the through-hole 68 passes through the slurry pools can be reduced. The reduction of the amount of the slurry flowing into the through-hole improves the measuring performance when the through-hole 68 passes across the substrate 20.

The sizes of the slurry pools differ according to the specifications of the slurry, the polishing pad, and the like. The slurry pools may not be produced in some cases. In such a case, according to the present embodiment, before the through-hole 68 has been blocked by the substrate 20, the amount of pure water is increased in the through-hole 68 to improve the measuring performance. For example, it is possible to reduce bubbles involved when the through-hole 68 moves below the substrate 20.

Next, there will be described control after completion of the polishing process. After the completion of the polishing process, the controller unit 28 sets a low-flow-rate mode and stops compulsory discharge. The ejection control valve V1 is closed, the low-flow-rate control valve V2 is opened, and the discharge control valve V3 is closed. Specifically, control similar to the control during the pre-blocking period is performed. This control should suitably be performed after polishing of a substrate is completed before polishing of a subsequent substrate is started. With such a control, it is possible to prevent pure water from flowing out of the through-hole 68 after the completion of the polishing process (when a substrate is replaced) and to prevent slurry from entering the through-hole 68.

A sequence of the above control process is performed, and pure water is ejected to the through-hole 68 each time the polishing table makes one revolution. However, within the scope of the present invention, pure water may be ejected once per several revolutions. Specifically, pure water may be ejected once per N revolutions (N≧2).

In this case, low-flow-rate supply and compulsory discharge may be performed during all the periods (including the pre-blocking period, the blocking period, and the post-blocking period) in any one of revolutions during which pure water is not ejected, as with the post-blocking period. A control shown in FIG. 7 is performed from the pre-blocking period right before the blocking period, during which pure water is ejected, until the next post-blocking period.

The above control is suitably used in a case where substrate measurement is conducted once per a plurality of revolutions. Ejection may be conducted in a revolution during which measurement is conducted. Thus, the frequency of ejection can be reduced, and the amount of outflow of pure water is also reduced.

In the above embodiment, the blocking period determines a switching timing of the flow-rate control. For setting a flow-rate control, a starting point of the blocking period is not required to coincide precisely with a point at which a substrate begins to overlap the through-hole. Similarly, an ending point of the blocking period is not required to coincide precisely with a point at which a substrate finishes overlapping the through-hole. Period setting shown in FIG. 6 in consideration of the guide ring can be considered as a setting example in which the blocking period does not coincide precisely with a period during which a substrate overlaps the through-hole. Further, switching points of the ejection control valve V1, the low-flow-rate control valve V2, and the discharge control valve V3 may not be precisely the same point.

As described above, according to a variation of the above control, when a fluid for measurement is ejected in an ejection mode, the low-flow-rate control valve V2 may not be closed. Specifically, the low-flow-rate control valve V2 may be opened at the time of ejection as well as at the time of low-flow-rate supply. In this control, it is also possible to switch low-flow-rate supply and ejection. From this point of view, the low-flow-rate control valve V2 may be eliminated.

In the present embodiment, the parallel section 50 including the main passage 52 and the sub passage 54 is used as a fluid supply means to the fluid chamber. However, the supply passage 42 may be arranged so as to have a flow-rate control valve capable of variably setting a flow rate of the fluid at a desired value and supplying the fluid.

A preferred embodiment of the present invention has been described above. It would be apparent to those skilled in the art that many variations may be made in the present embodiment without departing from the scope of the present invention. For example, a fluid for measurement is not limited to pure water.

As described above, according to the present invention illustrated in FIGS. 1 through 8, since supply of a fluid for measurement into a fluid chamber is controlled according to a positional relationship between the fluid chamber and a substrate, fluid supply can be restricted within a range in which the measuring capability can be maintained. Therefore, an outflow of the fluid for measurement can be reduced, and influence on the polishing performance from the fluid for measurement can be reduced.

According to the present invention, a fluid for measurement is supplied to a fluid chamber at a low flow rate during an unblocking period, during which the fluid chamber is not blocked by a substrate. Thus, while slurry is prevented from entering the fluid chamber, the fluid for measurement is prevented from flowing out during the unblocking period.

Further, according to the present invention, since compulsory discharge is controlled together with supply of a fluid for measurement, a fluid for measurement is properly prevented from flowing out of a fluid chamber to a surface of a polishing pad. Thus, the amount of the outflow can further be reduced. According to the present invention, compulsory discharge is restricted during the pre-blocking period. Thus, it is possible to increase the amount of fluid for measurement in the fluid chamber and to reduce the amount of slurry flowing into the fluid chamber when the fluid chamber passes through slurry pools immediately before the fluid chamber is moved below the substrate, thereby improving the measuring performance.

FIG. 9 is a view explanatory of a substrate polishing apparatus 10 according to a second embodiment of the present invention, which shows measurement portions of a polishing table (rotatable table) 12 in an enlarged manner. FIG. 9 corresponds to a portion of the sensor 24 in the entire arrangement shown in FIG. 1. As described above, a polishing pad 18 is placed on a polishing pad attachment surface 78 of the polishing table 12, and a substrate 20 is brought into contact with the polishing pad 18. A supply passage 42 and a discharge passage 44 are provided adjacent to each other in the polishing table 12.

The polishing pad 18 has a through-hole (opening) 68, and the supply passage 42 and the discharge passage 44 communicate with the through-hole 68. A pipe piece 1086 is mounted on the polishing table 12 for forming the supply passage 42 in the through-hole 68. An end of the pipe piece 1086 forms an outlet 1088 of a fluid for measurement. The outlet 1088 serves as a supply port for supplying a fluid for measurement, which is supplied through the supply passage 42, into the through-hole 68. The pipe piece 1086 is located within the through-hole 68. Specifically, the outlet 1088 is located above the polishing table 12 and near the polishing surface 16 of the polishing pad 18.

The pipe piece 1086 is an annular component, and is attached to the polishing table 12 at a threaded portion 1092. More specifically, the threaded portion 1092 is formed by an external thread on the pipe piece 1086 and an internal thread on the polishing table 12, which are coupled to each other. The threaded portion 1092 is arranged such that the outlet 1088 on an upper end of the pipe piece 1086 is located at a proper height in the through-hole 68 when the pipe piece 1086 is fasten to the polishing table 12. Although an exchangeable pipe piece 1086 is used in the present embodiment, a pipe that is fixed on the polishing table 12 and is not exchangeable may be used within the scope of the present invention.

In the substrate polishing apparatus 10 according to the present embodiment, a fluid for measurement, such as pure water, is supplied through the supply passage 42 and discharged through the discharge passage 44. The interior of the through-hole 68 is filled with transparent pure water, and slurry used for polishing is prevented from entering the through-hole 68. Thus, it is possible to perform measurement using transmitted light.

A light-emitting optical fiber 1080 and a light-receiving optical fiber 1082 are disposed within the supply passage 42. The light-emitting optical fiber 1080 and the light-receiving optical fiber 1082 are connected to the light source unit 30 and the photometer unit 32 (FIG. 1). The light-emitting optical fiber 1080 applies measurement light, which is supplied from the light source unit 30, to the substrate 20. The light-receiving optical fiber 1082 receives reflected light from the substrate 20 and transmits it to the photometer unit 32.

Next, there will be described an arrangement of the light-emitting optical fiber 1080 and the light-receiving optical fiber 1082 for improving a light-receiving efficiency of the reflected light from the substrate 20. In the present embodiment, the light-emitting optical fiber 1080 and the light-receiving optical fiber 1082 are disposed adjacent to each other and held in contact with each other. With such an arrangement of the light-emitting optical fiber 1080 and the light-receiving optical fiber 1082, an emitting end 1094 of the light-emitting optical fiber 1080 and an incident end 1096 of the light-receiving optical fiber 1082 are disposed adjacent to each other and directed toward the substrate 20. The light-emitting optical fiber 1080 and the light-receiving optical fiber 1082 are disposed so as to have a distance L from the emitting end 1094 of the light-emitting optical fiber 1080 and the incident end 1096 of the light-receiving optical fiber 1082 to the substrate 20.

There will be described below reasons why the above arrangement can improve a light-receiving efficiency of measurement light. First, reasons why the light-emitting optical fiber and the light-receiving optical fiber are disposed adjacent to each other will be described, and then setting of a distance L from the light-emitting optical fiber and the light-receiving optical fiber to the substrate will be described.

Figures 10A, 10B:
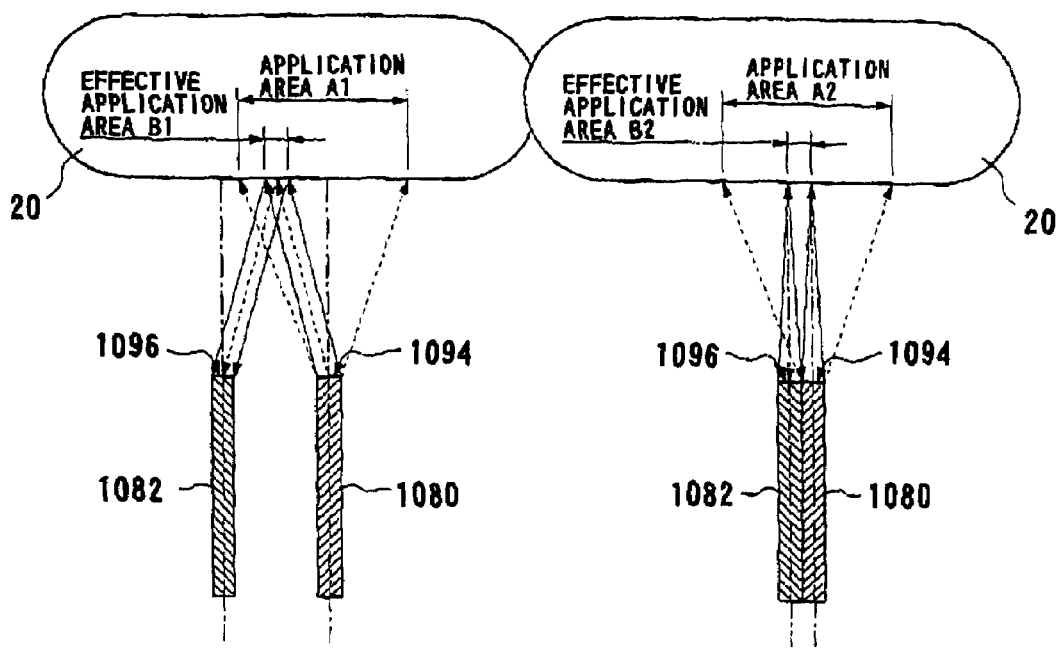
FIGS. 10A and 10B are schematic diagrams showing light-emitting and light-receiving between a light-emitting optical fiber and a light-receiving optical fiber and a substrate.

FIGS. 10A and 10B are schematic diagrams showing the light-emitting optical fiber 1080, the light-receiving optical fiber 1082, and the substrate 20. FIG. 10A shows an example in which the light-emitting optical fiber 1080 and the light-receiving optical fiber 1082 are spaced from each other, and FIG. 10B shows an example in which the light-emitting optical fiber 1080 and the light-receiving optical fiber 1082 are disposed adjacent to each other. The example shown in FIG. 10B corresponds to an arrangement of optical fibers in the present embodiment. As shown in FIG. 10A, measurement light, emitted from the light-emitting optical fiber 1080, is applied to the substrate 20. The measurement light applied to the substrate 20 is reflected from the substrate 20, and a portion of the reflected light is received by the light-receiving optical fiber 1082. A range to which measurement light to be received by the light-receiving optical fiber 1082 is applied is referred to as an "effective application area". Next, the quantity of measurement light applied to the effective application area will be described below.

Figure 10C:
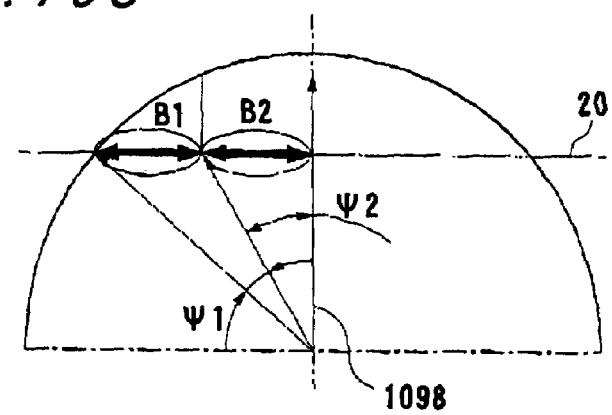
FIG. 10C is a diagram explanatory of the quantity of measurement light emitted to an effective application area.

FIG. 10C is a diagram explanatory of the quantity of measurement light emitted to an effective application area B1 shown in FIG. 10A and the quantity of measurement light emitted to an effective application area B2 shown in FIG. 10B. Generally, the quantity of light in a region is specified by a solid angle cutting the region. As shown in FIG. 10C, a solid angle $\Psi 1$ of the effective application area B1 is smaller than a solid angle $\Psi 2$ of the effective application area B2. Specifically, the quantity of light emitted to the effective application area B2 shown in FIG. 10B is larger than the quantity of light emitted to the effective application area B1 shown in FIG. 10A. As can be seen from FIG. 10C, a range closer to a perpendicular 1098 from the emitting end 1094 to the substrate 20 has a larger solid angle, which cuts the same area on the substrate 20. Specifically, an effective application area located closer to the front of the emitting end 1094 has a larger quantity of emitted light. Based on the above principles, the light-emitting optical fiber 1080 and the light-receiving optical fiber 1082 are disposed so that the emitting end 1094 of the light-emitting optical fiber 1080 and the incident end 1096 of the light-receiving optical fiber 1082 are adjacent to each other. With this arrangement, because a path of the measurement light is brought closer to being perpendicular to the substrate 20, the quantity of light emitted to the effective application area is increased. Thus, a light-receiving efficiency of measurement light can be improved.

Next, there will be described setting of a distance L from the emitting end 1094 of the light-emitting optical fiber 1080 and the incident end 1096 of the light-receiving optical fiber 1082 to the substrate 20.

When the light-emitting optical fiber 1080 and the light-receiving optical fiber 1082 are brought close to the substrate 20, the quantity of light emitted to the substrate 20 is increased per area. However, if the light-emitting optical fiber 1080 and the light-receiving optical fiber 1082 are brought excessively close to the substrate 20, then the quantity of reflected light to be received is reduced. These points of view will be described sequentially, and then setting of an optimal distance L from the light-emitting optical fiber 1080 and the light-receiving optical fiber 1082 to the substrate 20 for improving a light-receiving efficiency will be described.

There will be described with reference to FIGS. 11A and 11B reasons why the quantity of measurement light received is increased when the light-emitting optical fiber 1080 and the light-receiving optical fiber 1082 are brought close to the substrate 20.

Figure 11A:
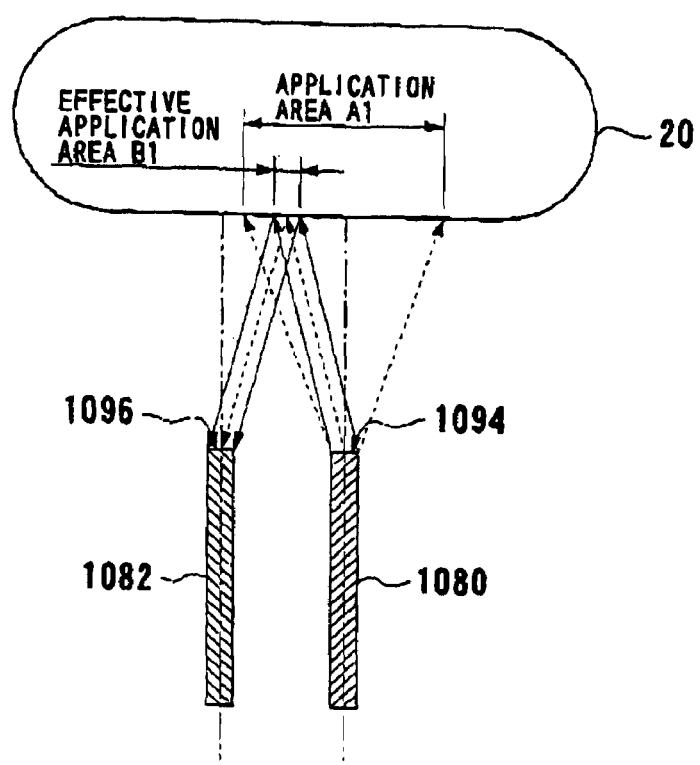
FIG. 11A is a schematic diagram showing light-emitting and light-receiving between a light-emitting optical fiber and a light-receiving optical fiber and a substrate.

FIG. 11A is a schematic diagram showing the light-emitting optical fiber 1080, the light-receiving optical fiber 1082, and the substrate 20. As shown in FIG. 11A, measurement light emitted from the light-emitting optical fiber 1080 is applied to the substrate 20. The measurement light applied to the substrate 20 is reflected from the substrate 20, and a portion of the reflected light is received by the light-receiving optical fiber 1082. Specifically, light of the measurement light applied to the substrate which is applied to the effective application area B1 shown in FIG. 11A reaches the light-receiving optical fiber 1082. Therefore, the quantity of light emitted to the effective application area B1 relates to the quantity of light received by the light-receiving optical fiber 1082. A relationship between the quantity of light emitted to the effective application area B1 and a distance will be described with reference to FIG. 11B.

Figure 11B:
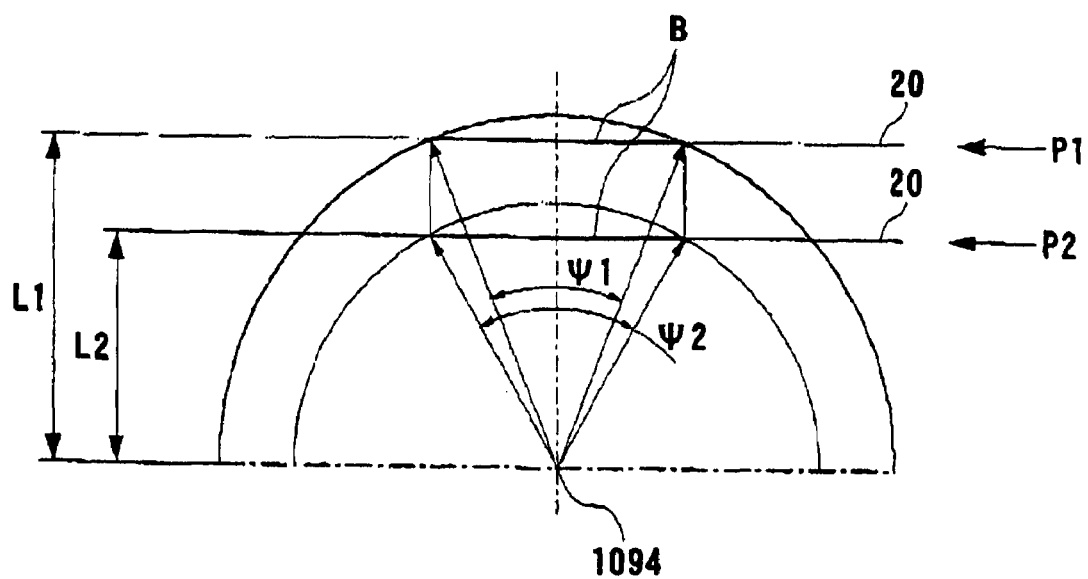
FIG. 11B is a diagram showing a relationship between a distance from an emitting end of a light-emitting optical fiber to a substrate and the quantity of light applied to the substrate.

FIG. 11B is a diagram showing a relationship between a distance from the emitting end 1094 of the light-emitting optical fiber 1080 to the substrate 20 and the quantity of light applied to the substrate 20 per area. FIG. 11B comparatively shows a case in which the substrate 20 is located at a position P1 and a case in which the substrate 20 is located at a position P2. In the case where the substrate 20 is located at the position P1, the quantity of light applied to the region B of the substrate 20 is represented by a solid angle $\Psi 1$, which cuts the region B. In the case where the substrate 20 is located at the position P2, the quantity of light applied to the region B of the substrate 20 is represented by a solid angle $\Psi 2$. Here, comparison of the quantities of light applied to the same region B in the cases of the position P1 and the position P2 shows that the quantity of applied light in the case where the substrate 20 is located at the position P2 is larger than that in the case where the substrate 20 is located at the position P1 ($\Psi 1 < \Psi 2$). Specifically, FIG. 11B shows that the quantity of light applied to the substrate 20 per area is increased when a distance from the emitting end 1094 of the light-emitting optical fiber 1080 to the substrate 20 is reduced. Therefore, in order to increase the quantity of light emitted to the effective application area B1 and to increase the quantity of light received by the light-receiving optical fiber 1082, it is desirable that a distance from the emitting end 1094 to the substrate 20 is short.

Figure 12A:
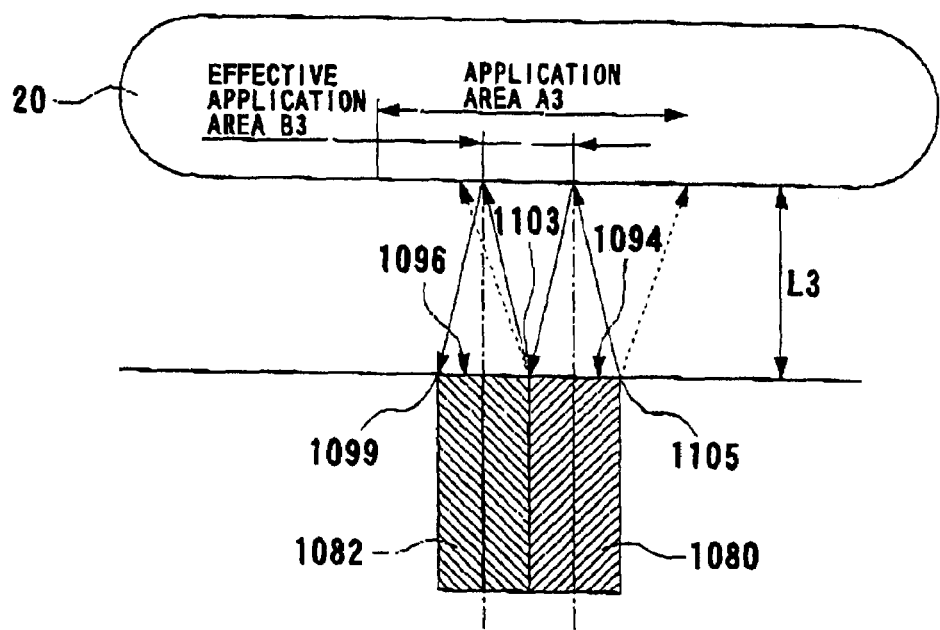
FIGS. 12A and 12B are schematic diagrams explanatory of a relationship between a distance from a light-emitting optical fiber and a light-receiving optical fiber to a substrate and an effective application area on the substrate.
Figure 12B:
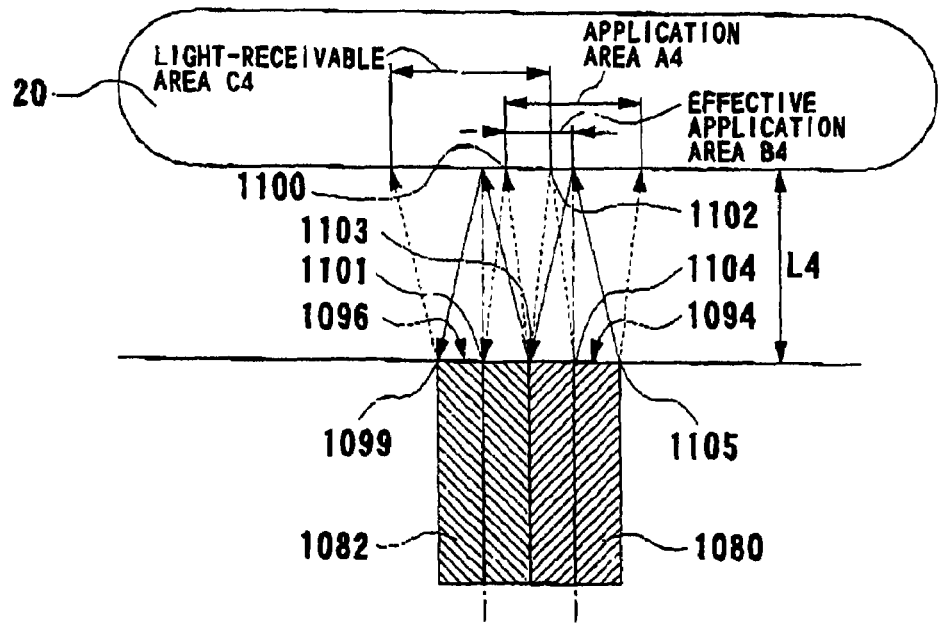

However, when the light-emitting optical fiber 1080 and the light-receiving optical fiber 1082 is brought excessively close to the substrate 20, the quantity of light reflected from the substrate 20 is reduced for the following reasons. FIGS. 12A and 12B will be referred. Here, the thicknesses of clads and coatings of the fibers are ignored for easy understanding.

FIGS. 12A and 12B are schematic diagrams explanatory of a relationship between distances L3, L4 from the light-emitting optical fiber 1080 and the light-receiving optical fiber 1082 to the substrate 20 and the effective application areas B3, B4 of the substrate 20. As shown in FIGS. 12A and 12B, measurement light emitted from the light-emitting optical fiber 1080 is applied to the substrate 20. The measurement light applied to the substrate 20 is reflected from the substrate 20, and a portion of the reflected light is received by the light-receiving optical fiber 1082. The emitting end 1094 of the light-emitting optical fiber 1080 and the incident end 1096 of the light-receiving optical fiber 1082 in the example shown in FIG. 12B are positioned closer to the substrate as compared to the example shown in FIG. 12A.

As shown in FIG. 12A, when a distance L3 is long, the measurement light emitted from the light-emitting optical fiber 1080 can reach an edge 1099 of the incident end 1096 of the light-receiving optical fiber 1082. In this case, the width of the effective application area B3 is determined by the width of the emitting end 1094 of the light-emitting optical fiber 1080. As can be seen from FIG. 12A, the application area A3 increasingly becomes larger when the distance L3 is longer, and the size of the effective application area B3 included in the application area A3 is maintained constant.

However, as shown in FIG. 12B, when the distance L4 is short, the effective application area B4 becomes smaller because of angles of divergence of the optical fibers 1080, 1082 for emitting and receiving light. Specifically, in FIG. 12B, light reflected from a point 1100 in the application area A4, which is the nearest point to the light-receiving optical fiber 1082, is received at a point 1101, which is located near the center of the incident end of the light-receiving optical fiber 1082. In other words, no light is received at portions ranging from the incident point 1101 to the edge 1099. Further, light reflected from a point 1102 in a light-receivable area C4, which is the nearest point to the light-emitting optical fiber 1080, is received at an edge 1103 of the incident end 1096 of the light-receiving optical fiber 1082. Specifically, light emitted from a surface ranging from the point 1104 to the edge 1105 on the emitting end 1094 of the light-emitting optical fiber 1080 does not reach the light-receiving optical fiber 1082. Accordingly, the effective application area B4 becomes small. As can be seen from FIG. 12B, the effective application area B4 becomes smaller when the distance L4 is shorter, and the quantity of received light is reduced. On the assumption that a distance between cores of the light-emitting optical fiber 1080 and the light-receiving optical fiber 1082 is zero, the quantity of light received by the light-receiving optical fiber 1082 is zero when L4=0.

As described above, an arrangement of the light-emitting optical fiber and the light-receiving optical fiber to improve a light-receiving efficiency of the measurement light is an arrangement in which the light-emitting optical fiber 1080 and the light-receiving optical fiber 1082 are positioned closest to the substrate 20 as long as an effective application area having a size as shown in FIG. 12A can be maintained. Next, the distance L meeting these conditions will be calculated.

Figure 13:
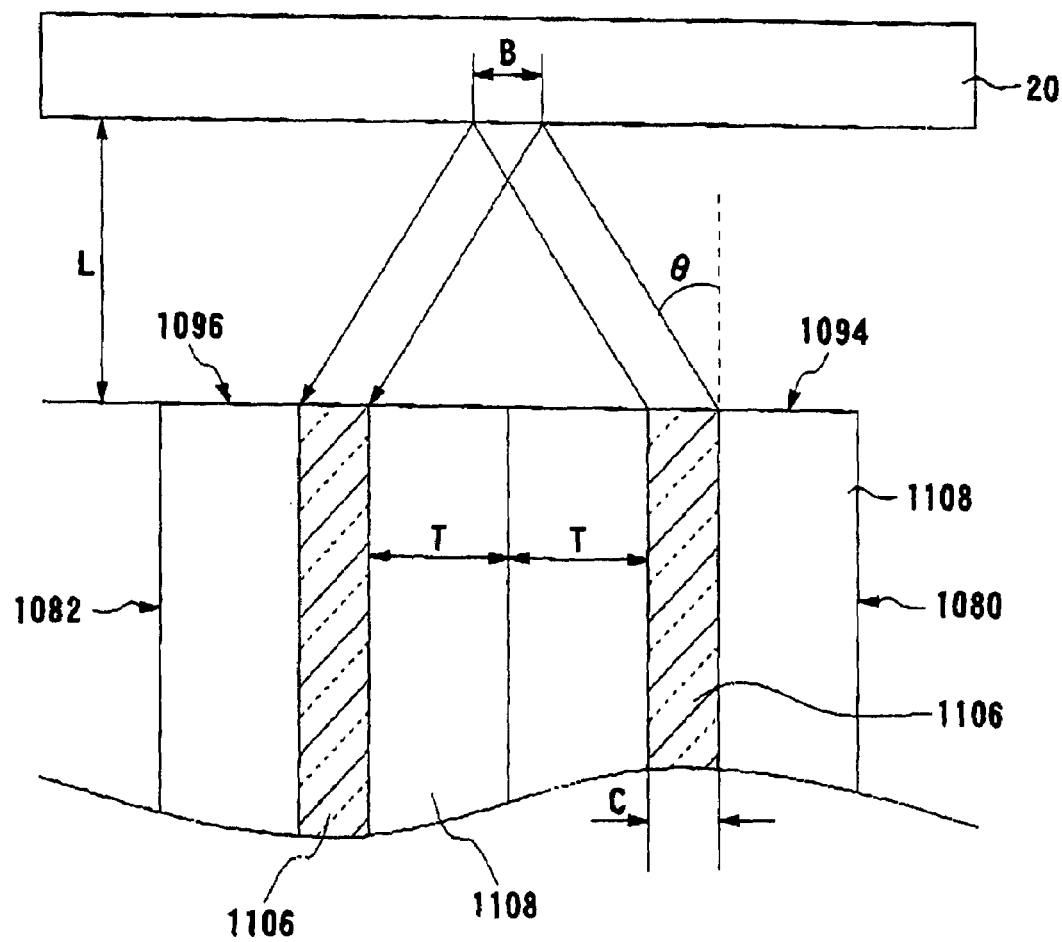
FIG. 13 is a diagram showing a light-emitting optical fiber, a light-receiving optical fiber, and a substrate.

FIG. 13 is a diagram showing the light-emitting optical fiber 1080, the light-receiving optical fiber 1082, and the substrate 20. The light-emitting optical fiber 1080 and the light-receiving optical fiber 1082 are disposed adjacent to each other. A clad 1108 of the light-emitting optical fiber 1080 and a clad 1108 of the light-receiving optical fiber 1082 are interposed between a core 1106 of the light-emitting optical fiber 1080 and a core of the light-receiving optical fiber 1082. The core 1106 of the light-emitting optical fiber 1080 and the core of the light-receiving optical fiber 1082 are spaced by the thickness of the clads 1108. Here, the light-emitting optical fiber 1080 and the light-receiving optical fiber 1082 are the same type of optical fiber. The clads 1108 have a thickness T. Practically, the clads 1108 may be covered with a covering layer, and the covering layer may further be coated with a coating layer. In such cases, the thicknesses of the covering layer and the coating layer may be included in the thickness T. Here, a minimum value of the distance L is calculated so as not to reduce the size of an effective application area as follows. When C is the diameter of the core 1106 of the optical fiber, and N is the NA value thereof, the following relationship holds from FIG. 13.

$$\tan\theta = (2T+C)/2L \quad (1)$$

The NA value in air (having a refractive index of 1) is represented by $\sin\theta$.

$$N = \sin\theta \quad (2)$$

The formula (1) and the formula (2) are solved for the distance L.

$$L = (1-N^2)^{1/2} \times (2T+C)/2N \quad (3)$$

Therefore, the value represented by the formula (3) is a minimum value of the distance L. The distance L meets the conditions that i) an effective application area is not reduced, and that ii) the light-emitting optical fiber 1080 and the light-receiving optical fiber 1082 are brought close to the substrate 20. Accordingly, the value represented by the formula (3) is an optimal value of the distance L.

In an actual substrate polishing apparatus 10, an optimal value of the distance L may be varied by a slight inclination of the optical fibers, conditions of paths of measurement light, and the like. Near the distance L, reduction of the quantity of received light due to reduction of an effective application area is cancelled by increase of the quantity of received light due to proximity of the optical fiber ends 1094, 1096. Resulted changes of the total quantity of received light differ according to the specifications of the respective optical fibers 1080, 1082. Therefore, it is desirable to adjust the distance from the light-emitting optical fiber 1080 and the light-receiving optical fiber 1082 to the substrate 20 near the distance L calculated as described above, thereby achieving an arrangement which can maximize a light-receiving efficiency.

Figure 14:
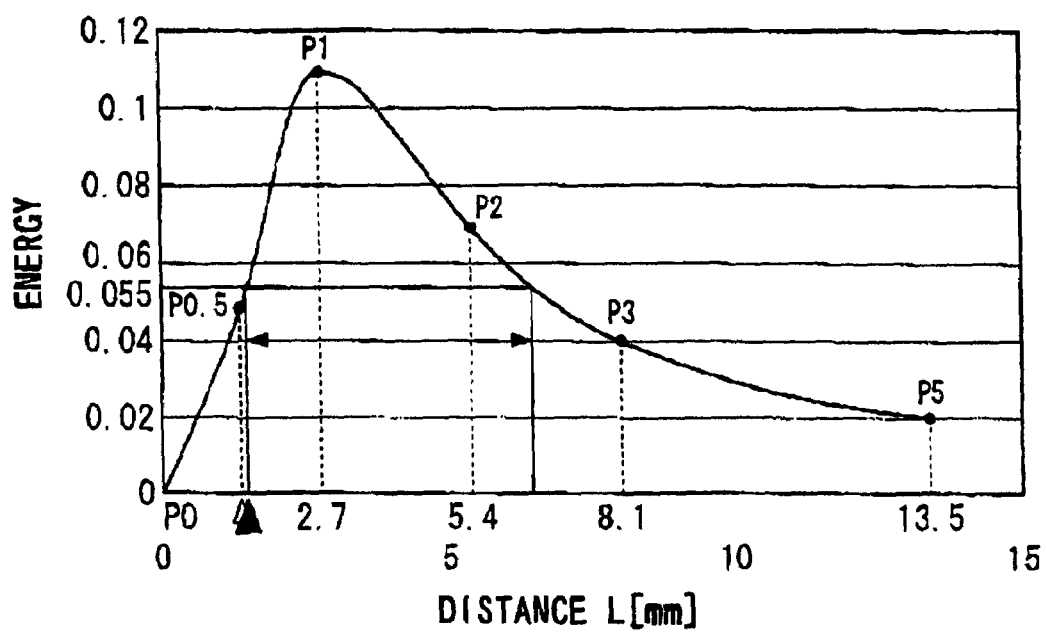
FIG. 14 is a result of an experiment for a relationship between a distance L from a light-emitting optical fiber and a light-receiving optical fiber to a substrate and the quantity of light received by the light-receiving optical fiber.

FIG. 14 is a result of an experiment conducted for calculating a relationship between the distance from the light-emitting optical fiber 1080 and the light-receiving optical fiber 1082 to the substrate 20 and the quantity of light received by the light-receiving optical fiber 1082. Here, a light-emitting optical fiber 1080 and a light-receiving optical fiber 1082 were provided in a pipe piece 1086 which had a mirror-finished inner surface. The light-emitting optical fiber 1080 and the light-receiving optical fiber 1082 were arranged so that an emitting end 1094 of the light-emitting optical fiber 1080 and an incident end 1096 of the light-receiving optical fiber 1082 were positioned 2 mm below an outlet 1088 of a pipe end. With the above arrangement, a distance from the pipe end to a substrate 20 was set as L in FIG. 14. According to the result, it can be seen that the quantity of received light became a maximum value when the distance L was 2.7 mm. When the distance was less than 2.7 mm, the quantity of received light was rapidly reduced. When the distance was more than 2.7 mm, the quantity of received light was also reduced. This result in the experiment coincides with the above description that there is an optimal distance to maximize a light-receiving efficiency.

The preferred second embodiment of the present invention has been described above. In the substrate polishing apparatus 10 according to the present embodiment, the light-emitting optical fiber 1080 and the light-receiving optical fiber 1082 are disposed adjacent to each other. The path of measurement light which is emitted from the light-emitting optical fiber 1080 and then received by the light-receiving optical fiber 1082 becomes substantially perpendicular to the substrate 20. Specifically, an effective application area for performing film measurement of the substrate 20 is positioned substantially on the front of the emitting end 1094 of the light-emitting optical fiber 1080 and the incident end 1096 of the light-receiving optical fiber 1082. Accordingly, it is possible to increase the quantity of light emitted to an effective application area and to increase the quantity of light received by the light-receiving optical fiber 1082.

Further, the distance L from the emitting end 1094 of the light-emitting optical fiber 1080 and the incident end 1096 of the light-receiving optical fiber 1082 to the substrate 20 is calculated based on angles of divergence of the light-emitting optical fiber 1080 and the light-receiving optical fiber 1082. More specifically, the distance L is set at a small value based on the angles of divergence as long as the effective application area is not reduced. Then, the light-emitting optical fiber 1080 and the light-receiving optical fiber 1082 are disposed based on the calculated distance L to enhance a light-receiving efficiency of the measurement light.

Next, a substrate polishing apparatus 10 according to a third embodiment of the present invention will be described below. The substrate polishing apparatus 10 in the third embodiment basically has the same arrangement as the substrate polishing apparatus 10 in the second embodiment, but has a different arrangement of a light-emitting optical fiber 1080 and a light-receiving optical fiber 1082.

Figure 15:
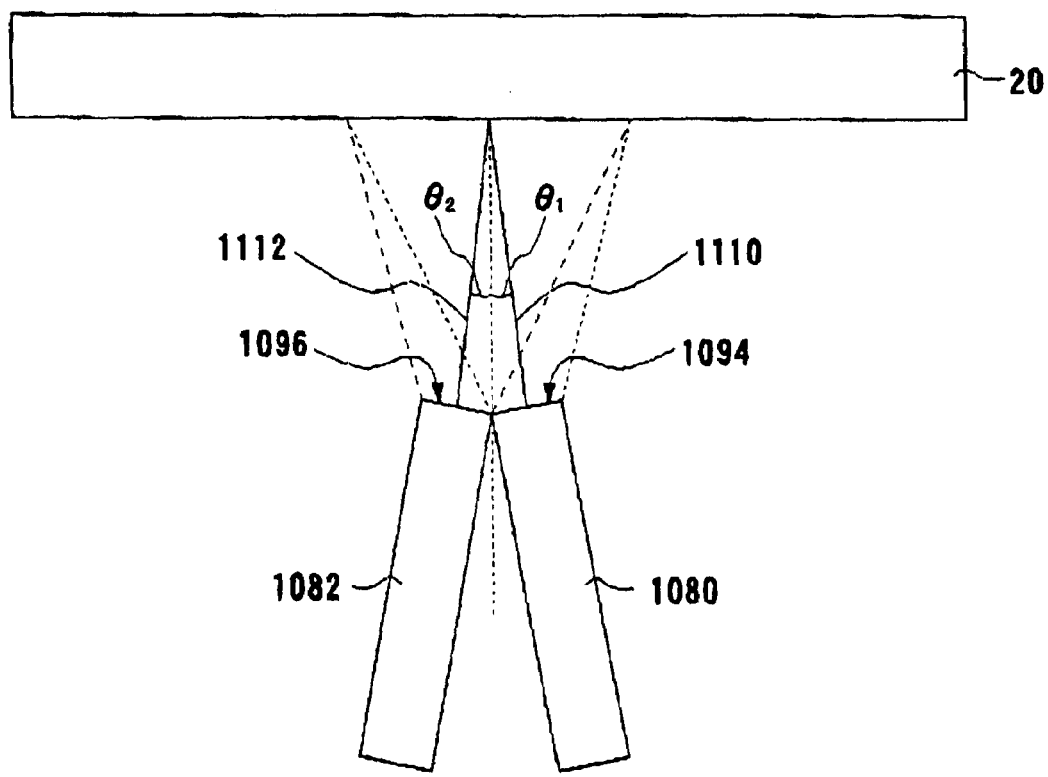
FIG. 15 is a diagram showing an arrangement of a light-emitting optical fiber and a light-receiving optical fiber according to a third embodiment of the present invention.

FIG. 15 is a diagram showing an arrangement of the light-emitting optical fiber 1080 and the light-receiving optical fiber 1082 in the substrate polishing apparatus 10 according to the third embodiment. In the substrate polishing apparatus 10 according to the third embodiment, an optical axis 1110 of the light-emitting optical fiber 1080 and an optical axis 1112 of the light-receiving optical fiber 1082 are inclined. More specifically, the optical axis 1110 of the light-emitting optical fiber 1080 is inclined toward the light-receiving optical fiber 1082. The optical axis 1112 of the light-receiving optical fiber 1082 is inclined toward the light-emitting optical fiber 1080. The optical axis 1110 of the light-emitting optical fiber 1080 is inclined at an angle θ1 with respect to a normal line of the substrate 20, and the optical axis 1112 of the light-receiving optical fiber 1082 is inclined at an angle θ2 with respect to the normal line of the substrate 20.

Strong light is emitted from the optical fiber in a direction in which the optical axis extends. Since the optical axis 1110 of the light-emitting optical fiber 1080 is inclined toward the light-receiving optical fiber 1082, it is possible to enhance the strength of light directed to the light-receiving optical fiber 1082. Further, the light-receiving optical fiber 1082 has high sensitivity to light entering from a direction along the optical axis. Since the optical axis 1112 of the light-receiving optical fiber 1082 is inclined toward the light-emitting optical fiber 1080, it is possible to receive reflected light with high sensitivity. Thus, it is possible to improve a light-receiving efficiency of measurement light.

It is desirable that an inclination angle θ1 of the optical axis 1110 of the light-emitting optical fiber 1080 is equal to an inclination angle θ2 of the optical axis 1112 of the light-receiving optical fiber 1082. Since the inclination angles are equal, the optical axis 1110 of the light-emitting optical fiber 1080 and the optical axis 1112 of the light-receiving optical fiber 1082 are symmetrical with respect to the normal line of the semiconductor substrate 20. Therefore, a traveling direction of light reflected from the substrate 20 substantially coincides with the optical axis 1112 of the light-receiving optical fiber 1082. Thus, it is possible to improve a light-receiving efficiency of measurement light. In this case, the emitting end 1094 of the light-emitting optical fiber 1080 and the incident end 1096 of the light-receiving optical fiber 1082 may be shifted toward the substrate 20. When the light-receiving optical fiber 1082 is brought close to the substrate 20 according to an angle of divergence of the light-emitting optical fiber 1080, it is possible to reduce influence of disturbance.

Next, a substrate polishing apparatus 10 according to a fourth embodiment of the present invention will be described below. The substrate polishing apparatus 10 in the fourth embodiment basically has the same arrangement as the substrate polishing apparatus 10 in the third embodiment, but lenses are attached to a light-emitting optical fiber 1080 and a light-receiving optical fiber 1082.

Figure 16:
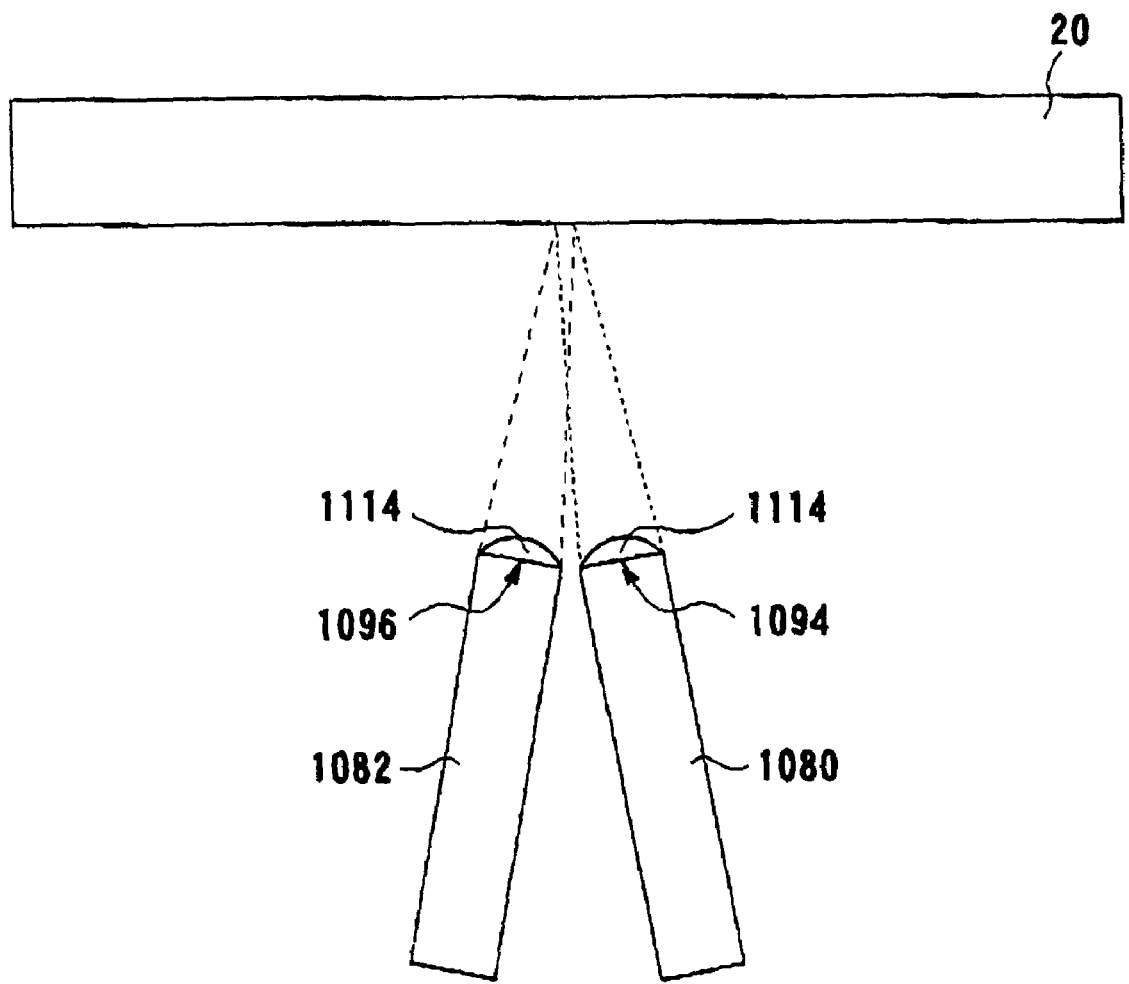
FIG. 16 is a diagram showing a light-emitting optical fiber and a light-receiving optical fiber according to a fourth embodiment of the present invention.

FIG. 16 is a diagram showing an arrangement of the light-emitting optical fiber 1080 and the light-receiving optical fiber 1082 in the substrate polishing apparatus 10 according to the fourth embodiment. As with the third embodiment, an optical axis of the light-emitting optical fiber 1080 and an optical axis of the light-receiving optical fiber 1082 are inclined. Further, lenses 1114 are attached to an emitting end 1094 of the light-emitting optical fiber 1080 and an incident end 1096 of the light-receiving optical fiber 1082, respectively. The lens 1114 attached to the light-emitting optical fiber 1080 has a function to condense measurement light emitted from the light-emitting optical fiber 1080 to the substrate 20. The lens 1114 attached to the light-receiving optical fiber 1082 has a function to condense light reflected from the substrate 20 to a core.

FIGS. 17A and 17B are schematic diagrams showing a surface of a substrate 20 to be polished in an enlarged manner. As shown in FIGS. 17A and 17B, the surface of the substrate 20 to be polished has a pattern. Specifically, Al interconnections 1115 are formed on a $SiO_2$ substrate 1113 so as to form a pattern corresponding to the Al interconnections 1115. As shown in FIG. 11A, the pattern has irregularities on a surface to which measurement light is emitted.

According to the present embodiment, since the lens 1114 attached to the emitting end 1094 of the light-emitting optical fiber 1080 condenses measurement light to the substrate 20, measurement light can emitted limitedly to a small area. As shown in FIG. 17B, when measurement light is emitted to an area having no irregularities (e.g. relatively large interconnection portions), measurement of film thickness can accurately be performed based on the reflected light. Particularly, this is effective in a case where properties of a film are measured by using interference of light. Further, light reflected from the substrate 20 is condensed by the lens 1114 attached to the light-receiving optical fiber 1082 and then received. Specifically, as shown in FIG. 17B, light from an area from which measurement light is reflected is condensed while light received from other areas is reduced. Thus, it is possible to reduce components of noise and to improve an S/N ratio of measurement light.

In the present embodiment, the lenses 1114 are attached to the emitting end 1094 of the light-emitting optical fiber 1080 and the incident end 1096 of the light-receiving optical fiber 1082. However, instead of attaching the lenses 1114, lenses may be formed by processing ends of the light-emitting optical fiber 1080 and the light-receiving optical fiber 1082.

Next, a substrate polishing apparatus 10 according to a fifth embodiment of the present invention will be described below. The substrate polishing apparatus 10 in the fifth embodiment basically has the same arrangement as the substrate polishing apparatus 10 in the second embodiment.

Figure 18:
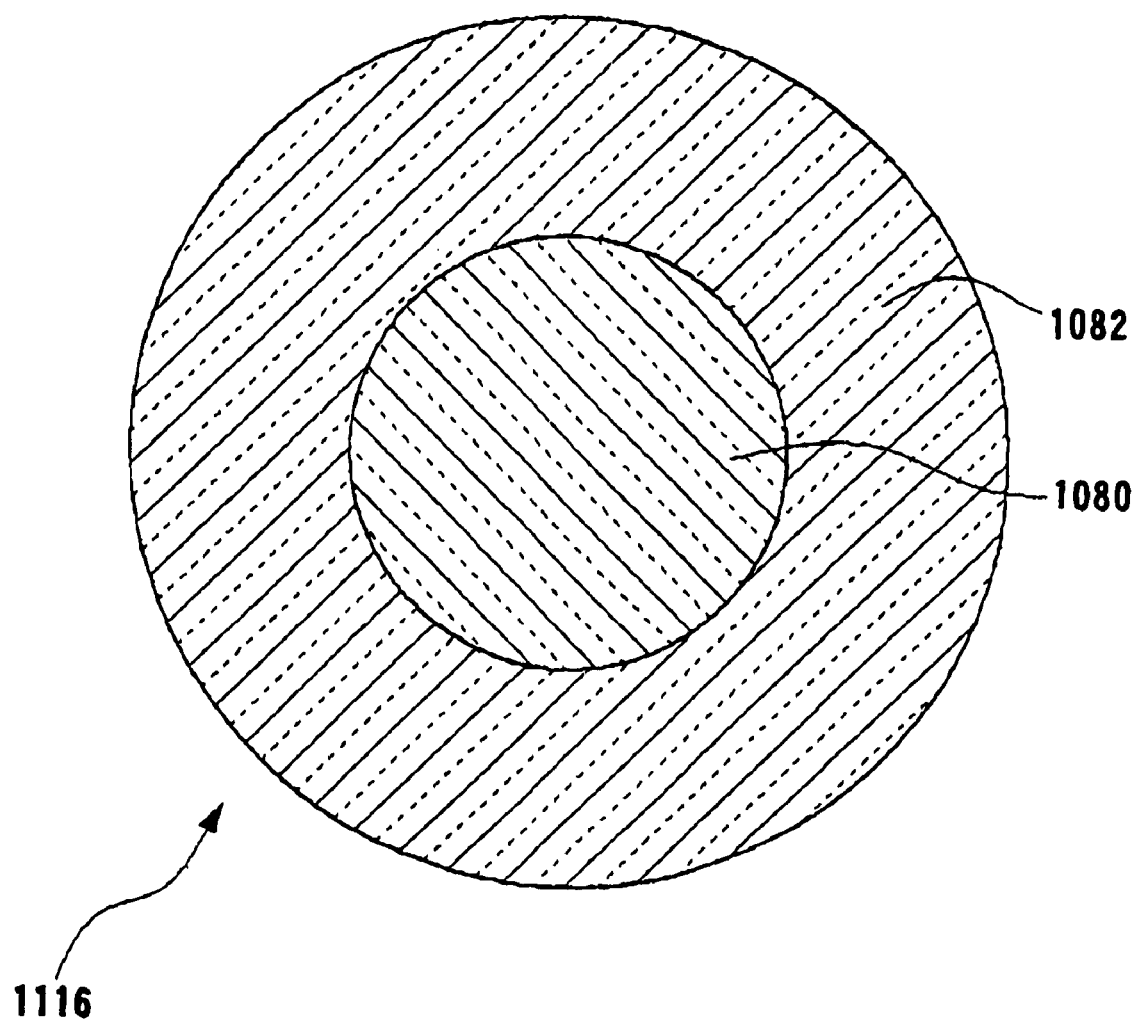
FIG. 18 is a cross-sectional view of a light-emitting optical fiber and a light-receiving optical fiber according to a fifth embodiment of the present invention.

FIG. 18 is a cross-sectional view of the light-emitting optical fiber 1080 and the light-receiving optical fiber 1082 which are used in the substrate polishing apparatus 10 according to the fifth embodiment. In the present embodiment, the light-emitting optical fiber 1080 and the light-receiving optical fiber 1082 form an optical fiber member 1116. The light-receiving optical fiber 1082 covers the light-emitting optical fiber 1080. More specifically, a core of the light-emitting optical fiber 1080 is covered with a clad, and a core of the light-receiving optical fiber 1082 is provided outside of the clad. The core of the light-receiving optical fiber 1082 is further covered with a clad. The clad provided between the core of the light-emitting optical fiber 1080 and the core of the light-receiving optical fiber 1082 serves as a clad of the light-emitting optical fiber 1080 and as a clad of the light-receiving optical fiber 1082.

Figure 19A:
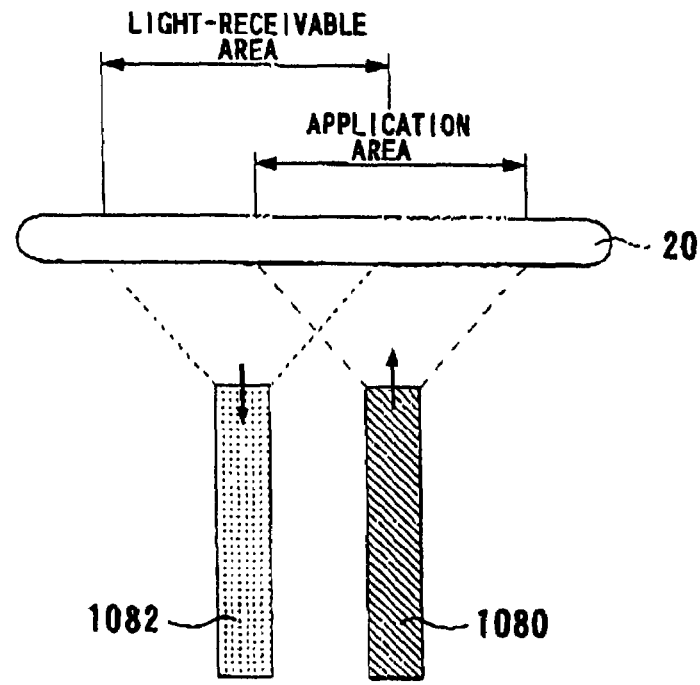
FIG. 19A is a diagram showing an application area and a light-receivable area in a conventional example.
Figure 19B:
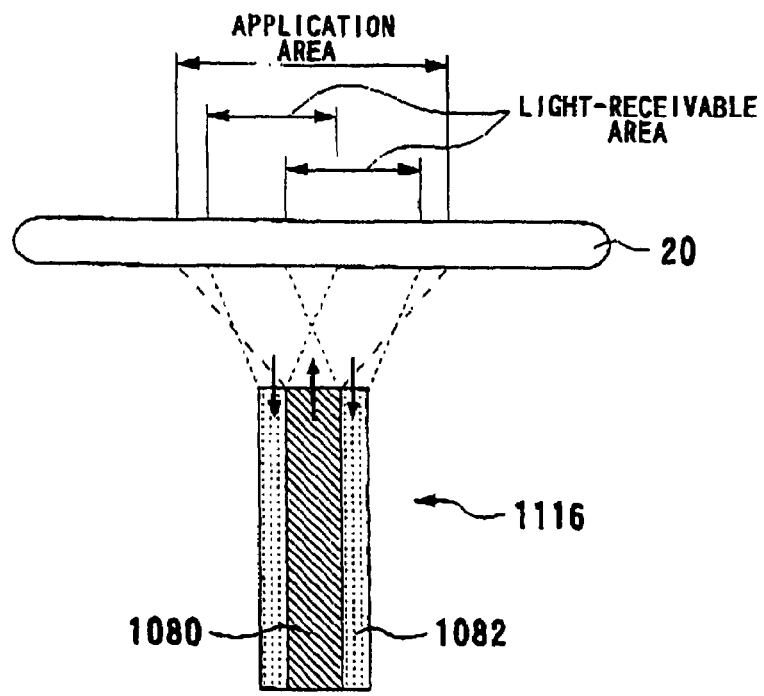
FIG. 19B is a diagram showing an application area and a light-receivable area in the fifth embodiment.

FIG. 19A is a diagram showing an application area of the light-emitting optical fiber 1080 and a light-receivable area of the light-receiving optical fiber 1082 in a conventional example, and FIG. 19B is a diagram showing an application area of the light-emitting optical fiber 1080 and a light-receivable area of the light-receiving optical fiber 1082 in the fifth embodiment. It can be seen from FIGS. 19A and 19B that since the light-receiving optical fiber 1082 surrounds the light-emitting optical fiber 1080 in the fifth embodiment, the application area of measurement light emitted from the light-emitting optical fiber 1080 and the light-receivable area of the light-receiving optical fiber 1082 have an overlapped area in the same direction. Therefore, it is possible to improve a light-receiving efficiency of measurement light reflected from the substrate 20.

In the fifth embodiment, the core of the light-emitting optical fiber 1080 and the core of the light-receiving optical fiber 1082 are disposed adjacent to each other via a common clad. Since an interval between the cores is thus small, an application area of the light-emitting optical fiber 1080 and a light-receivable area of the light-receiving optical fiber 1082 can have a large overlapping area. Accordingly, the light-emitting optical fiber 1080 and the light-receiving optical fiber 1082 can be brought closer to the substrate 20. As described above, light received by the light-receiving optical fiber 1082 becomes substantially perpendicular to the substrate 20. Therefore, a solid angle becomes large during emitting light to thus increase the quantity of light.

The light-emitting optical fiber 1080 and the light-receiving optical fiber 1082 may be integrally formed by bonding or the like to form the optical fiber member 1116. The light-emitting optical fiber 1080 and the light-receiving optical fiber 1082 may be separated from each other. This also holds true in the other embodiments.

Figure 20A:
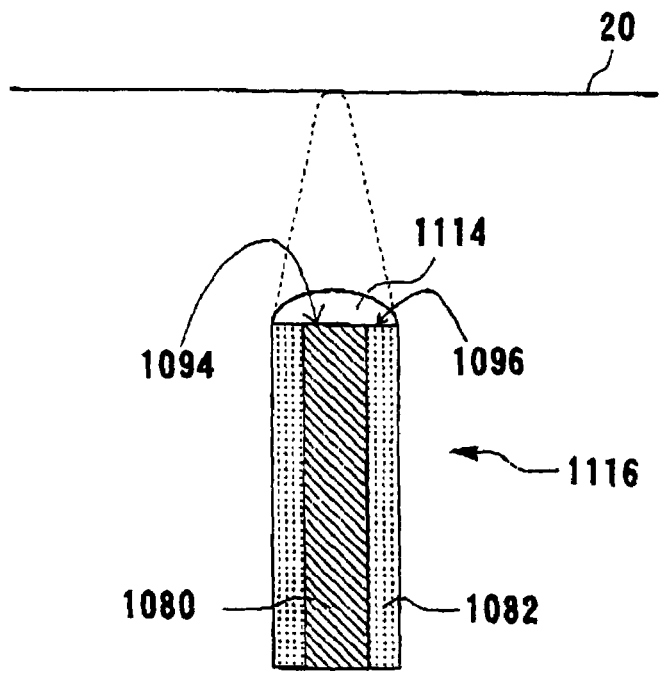
FIG. 20A is a diagram showing a light-emitting optical fiber and a light-receiving optical fiber which are used in a variation of the fifth embodiment.
Figure 20B:
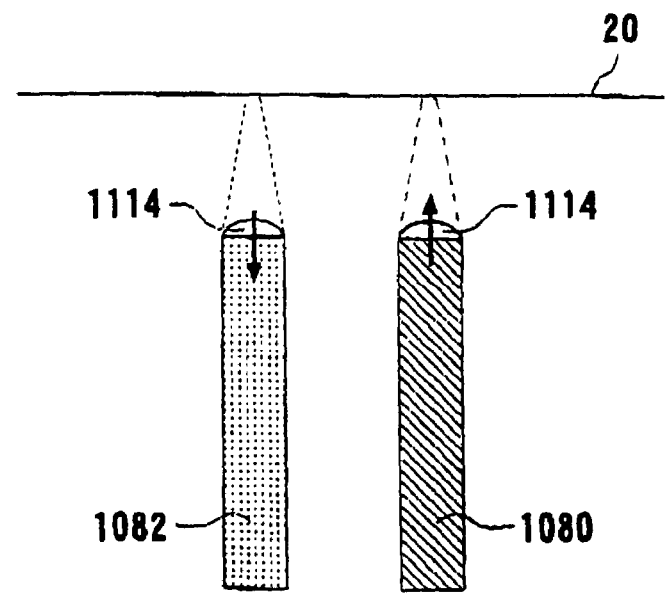
FIG. 20B is a configurational example in which lenses are attached to a light-emitting optical fiber and a light-receiving optical fiber.

FIG. 20A is a diagram showing a light-emitting optical fiber 1080 and a light-receiving optical fiber 1082 which are used in a variation of the fifth embodiment, and FIG. 20B is a configurational example in which lenses 1114 are attached to an emitting end 1094 of a light-emitting optical fiber 1080 and an incident end 1096 of a light-receiving optical fiber 1082, respectively. In the variation shown in FIG. 20A, a lens 1114 is attached so as to cover an emitting end 1094 of a light-emitting optical fiber 1080 and an incident end 1096 of a light-receiving optical fiber 1082. The lens 1114 has a function to condense measurement light emitted from the light-emitting optical fiber 1080 into a substrate 20, and to condense reflected light from the substrate 20. With this arrangement, a focal point to condense the measurement light and a focal point to condense the reflected light are common, unlike the example shown in FIG. 20B. Accordingly, the measurement light emitted from the light-emitting optical fiber 1080 can be condensed to the substrate 20, and the light reflected from the substrate 20 can be condensed to the light-receiving optical fiber 1082. Thus, it is possible to improve an S/N ratio of measurement light.

In the present embodiment, there has been described an arrangement in which the light-emitting optical fiber 1080 is covered with the light-receiving optical fiber 1082. However, the light-receiving optical fiber 1082 may be covered with the light-emitting optical fiber 1080. In the variation, the lens 1114 is attached to the light-emitting optical fiber 1080 and the light-receiving optical fiber 1082. A lens may be formed by processing the emitting end 1094 of the light-emitting optical fiber 1080 and the incident end 1096 of the light-receiving optical fiber 1082.

Next, a substrate polishing apparatus 10 according to a sixth embodiment of the present invention will be described below. The substrate polishing apparatus 10 in the sixth embodiment basically has the same arrangement as the substrate polishing apparatus 10 in the second embodiment.

Figure 21:
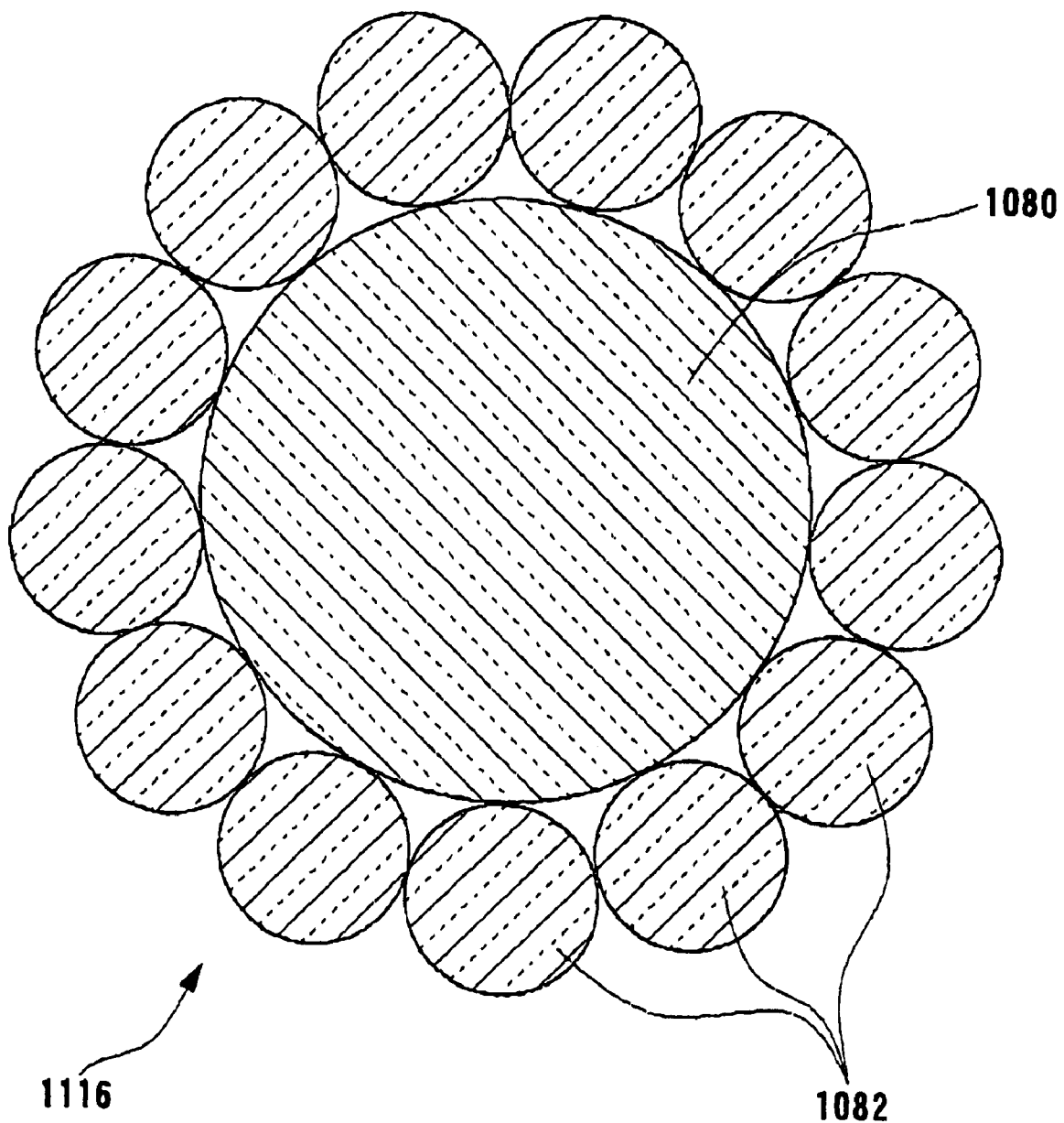
FIG. 21 is a cross-sectional view of a light-emitting optical fiber and light-receiving optical fibers which are used in a sixth embodiment of the present invention.

FIG. 21 is a cross-sectional view of a light-emitting optical fiber 1080 and light-receiving optical fibers 1082 which are used in the substrate polishing apparatus 10 according to the sixth embodiment. The light-emitting optical fiber 1080 and the light-receiving optical fibers 1082 form an optical fiber member 1116. In the present embodiment, a light-emitting optical fiber 1080 is surrounded by a plurality of light-receiving optical fibers 1082. The light-receiving optical fibers 1082 are arranged around the light-emitting optical fiber 1080 at equal intervals.

With an arrangement in which a plurality of light-receiving optical fibers 1082 is disposed around the light-emitting optical fiber 1080, it is possible to increase a ratio of receiving measurement light and improve an S/N ratio of the measurement light. In the substrate polishing apparatus 10, the light-emitting optical fiber 1080 and the light-receiving optical fibers 1082 are disposed in a supply passage 42 for supplying a fluid for measurement. With an arrangement in which a plurality of light-receiving optical fibers 1082 is disposed around the light-emitting optical fiber 1080, a fluid for measurement passes through spaces between the light-emitting optical fiber 1080 and the light-receiving optical fibers 1082 and spaces between the light-receiving optical fibers 1082. Thus, the light-emitting optical fiber 1080 and the light-receiving optical fibers 1082 are effectively cleaned by the fluid for measurement.

Figure 22:
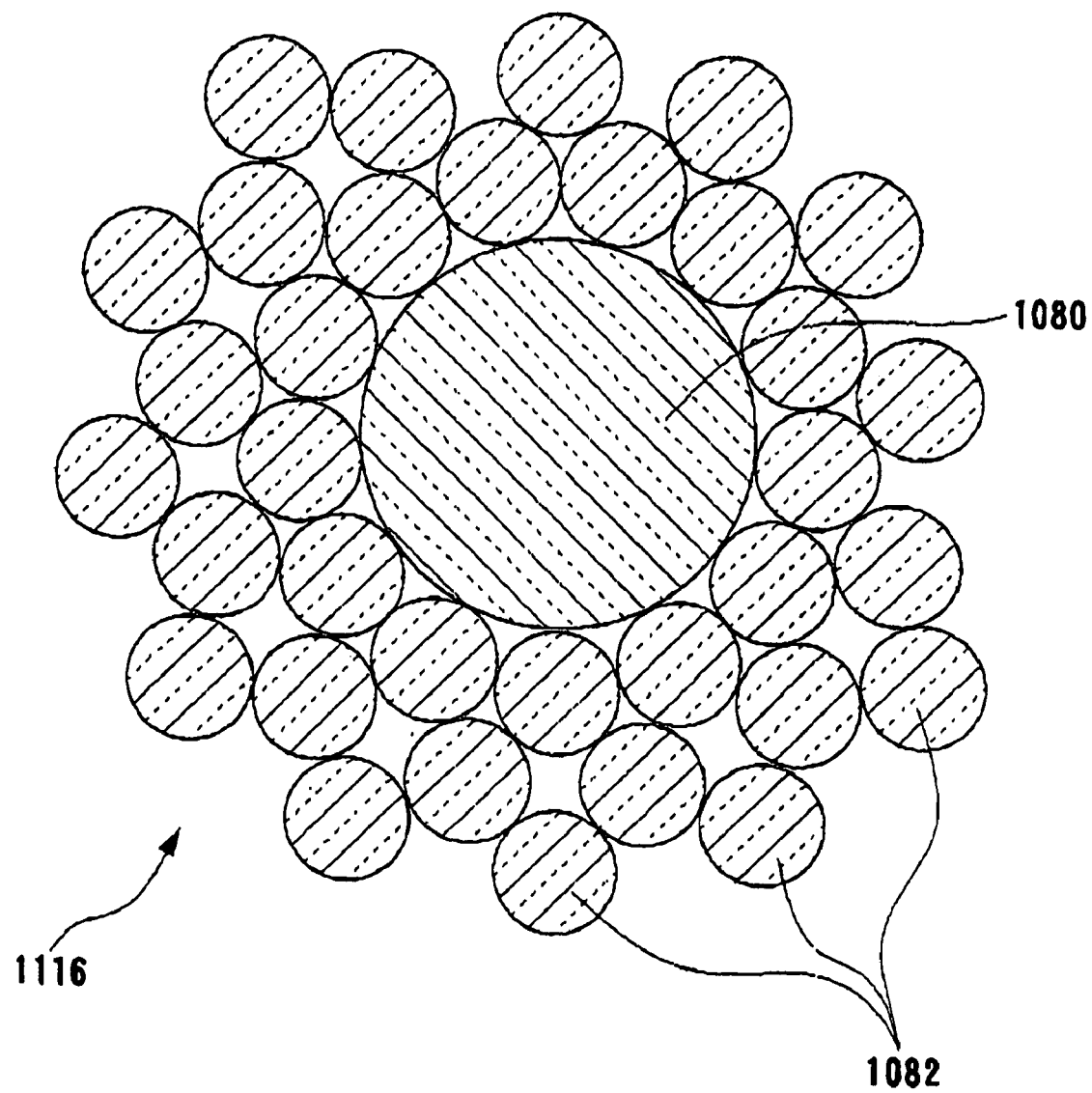
FIG. 22 is a cross-sectional view of a light-emitting optical fiber and light-receiving optical fibers which are used in a variation of the sixth embodiment.

FIG. 22 is a cross-sectional view of a light-emitting optical fiber 1080 and light-receiving optical fibers 1082 which are used in a variation of the sixth embodiment. This variation differs from the above embodiment in that a plurality of light-receiving optical fibers 1082 is disposed randomly so as to surround a light-emitting optical fiber 1080. Specifically, a plurality of light-receiving optical fibers 1082 is bundled around a light-emitting optical fiber 1080. This arrangement also has an advantage of improving a light-receiving efficiency of measurement light, as with the above embodiment.

In the above embodiments, a plurality of light-receiving optical fibers 1082 surrounds a light-emitting optical fiber 1080. However, a plurality of light-emitting optical fibers 1080 can surround a light-receiving optical fiber 1082. As with the variation of the fifth embodiment, a lens may be attached to a light-emitting optical fiber 1080 and a plurality of light-receiving optical fibers 1082 so as to cover an emitting end and respective incident ends thereof.

Next, a substrate polishing apparatus 10 according to a seventh embodiment of the present invention will be described below. The substrate polishing apparatus 10 in the seventh embodiment basically has the same arrangement as the substrate polishing apparatus 10 in the second embodiment.

Figure 23:
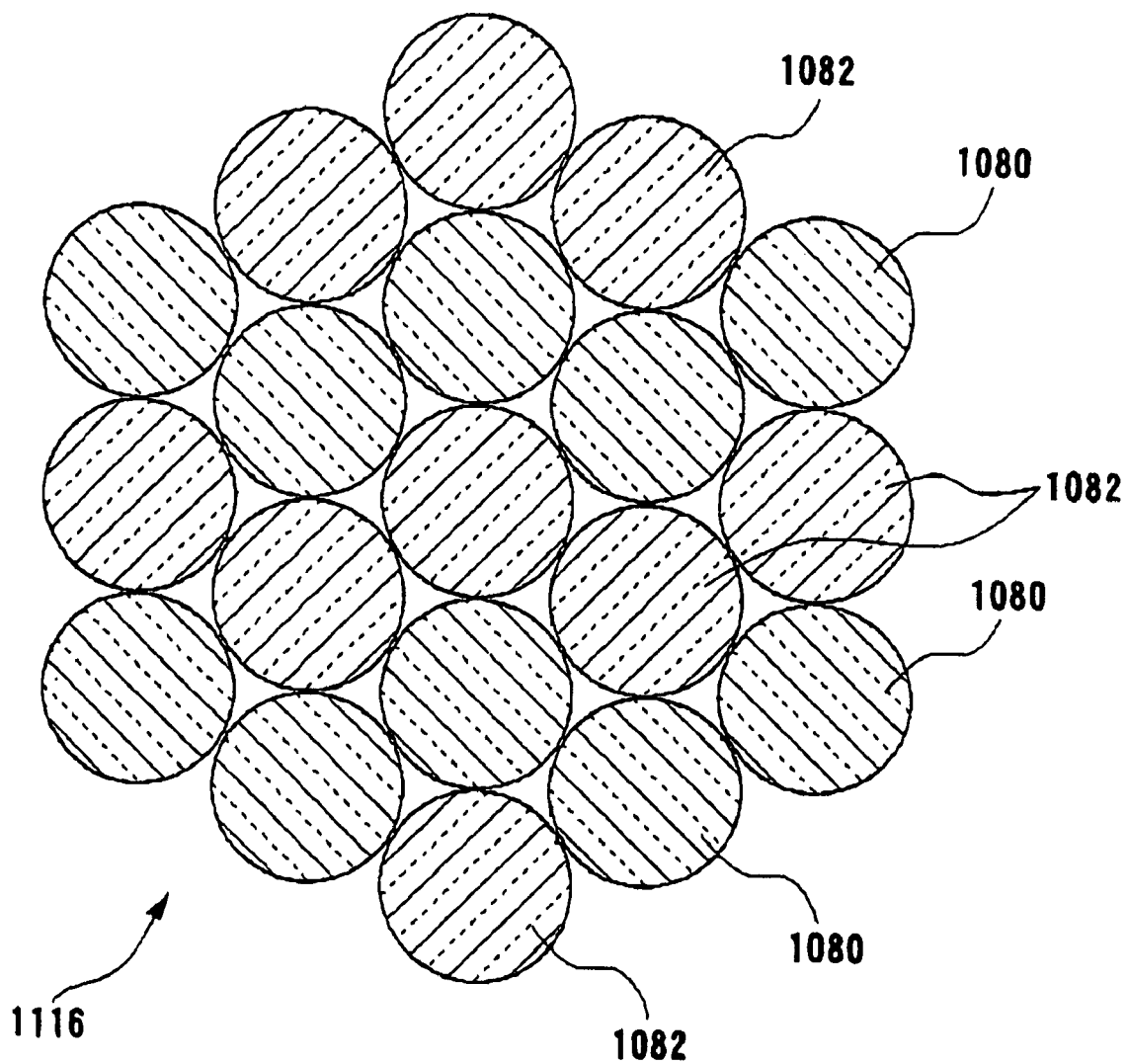
FIG. 23 is a cross-sectional view of light-emitting optical fibers and light-receiving optical fibers which are used in a seventh embodiment of the present invention.

FIG. 23 is a cross-sectional view of light-emitting optical fibers 1080 and light-receiving optical fibers 1082 which are used in the substrate polishing apparatus 10 according to the seventh embodiment. In the present embodiment, the substrate polishing apparatus 10 has a plurality of light-emitting optical fibers 1080 and a plurality of light-receiving optical fibers 1082, which form an optical fiber member 1116. A plurality of light-emitting optical fibers 1080 and a plurality of light-receiving optical fibers 1082 are bundled together. Six light-emitting optical fibers 1080 or light-receiving optical fibers 1082 are disposed around a light-emitting optical fiber 1080 or light-receiving optical fiber 1082. The light-emitting optical fibers 1080 and the light-receiving optical fibers 1082 are arranged so that two to four light-receiving optical fibers 1082 are present around a light-emitting optical fiber 1080, and that two to four light-emitting optical fibers 1080 are present around a light-receiving optical fiber 1082.

Thus, a proper number of light-receiving optical fibers 1082 are disposed around a light-emitting optical fiber 1080, and a proper number of light-emitting optical fibers 1080 are disposed around a light-receiving optical fiber 1082. Accordingly, it is possible to increase a ratio of receiving measurement light by the light-receiving optical fibers 1082 and to improve an S/N ratio. Preferably, optical fibers disposed around light-emitting optical fibers 1080 contain 30–70% light-receiving optical fibers 1082, and optical fibers disposed around light-receiving optical fibers 1082 contain 30–70% light-emitting optical fibers 1080. When the light-emitting optical fibers 1080 and light-receiving optical fibers 1082 are disposed at the above rates, it is possible to increase a ratio of receiving measurement light and to improve an S/N ratio.

Next, a substrate polishing apparatus 10 according to an eighth embodiment of the present invention will be described below. The substrate polishing apparatus 10 in the eighth embodiment basically has the same arrangement as the substrate polishing apparatus 10 in the second embodiment.

FIG. 24 is a cross-sectional view of light-emitting optical fibers 1080 and light-receiving optical fibers 1082 which are used in the substrate polishing apparatus 10 according to the eighth embodiment. In the eighth embodiment, a plurality of light-emitting optical fibers 1080 and a plurality of light-receiving optical fibers 1082 are bundled together, as with the seventh embodiment, and form an optical fiber member 1116. In the eighth embodiment, a bundle of a plurality of light-emitting optical fibers 1080 is surrounded by a plurality of light-receiving optical fibers 1082.

Figure 25:
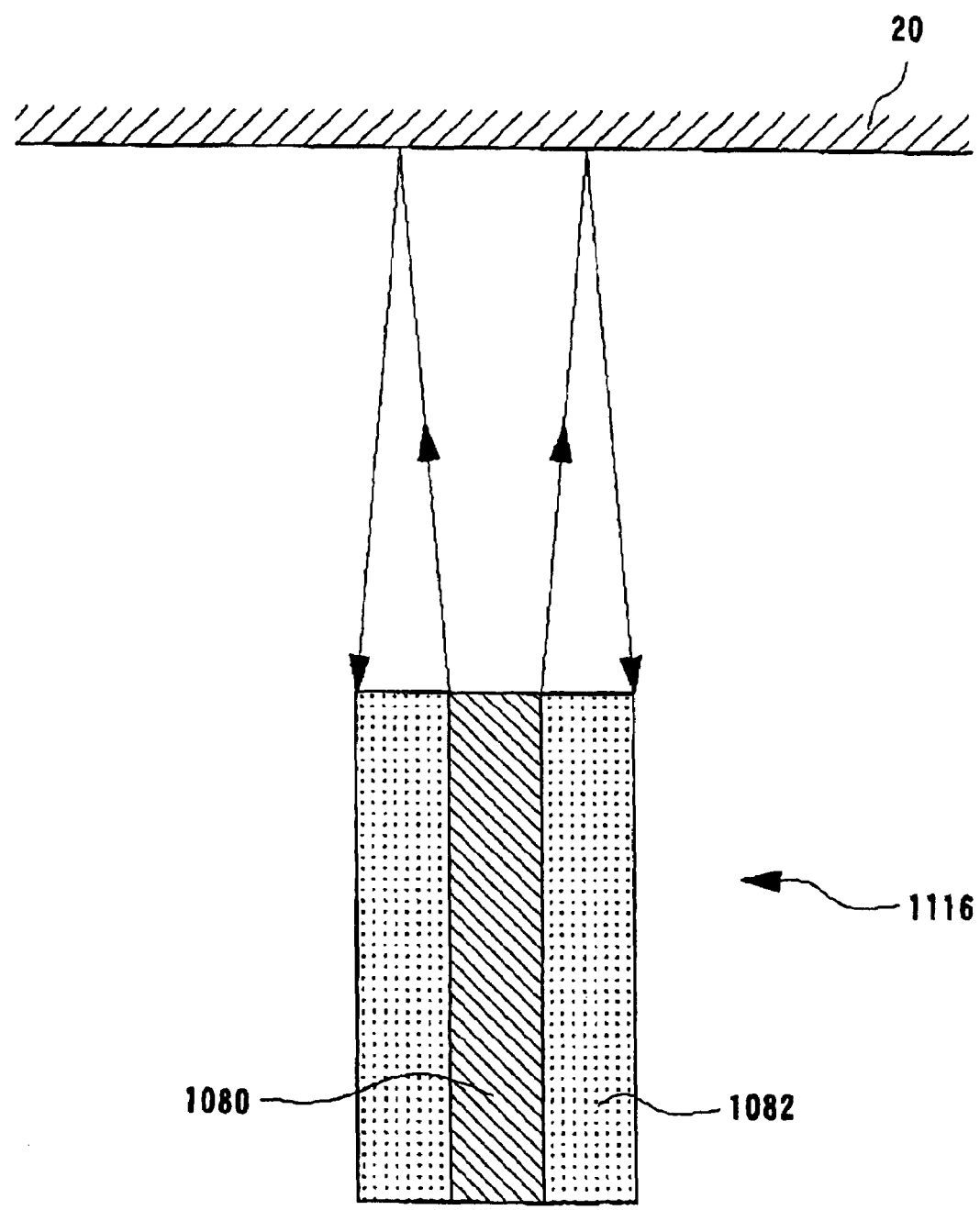
FIG. 25 is a schematic diagram showing paths of measurement light in the eighth embodiment.

FIG. 25 is a schematic diagram showing paths of measurement light in the eighth embodiment. As shown in FIG. 25, with an arrangement in which a plurality of light-emitting optical fibers 1080 is surrounded by a plurality of light-receiving optical fibers 1082, it is possible to improve a light-receiving efficiency of reflected light by the light-receiving optical fibers 1082. Further, since the light-emitting optical fibers 1080 are bundled, it is possible to restrict a range to which measurement light is applied from the light-emitting optical fibers 1080.

FIG. 26 is a cross-sectional view of light-emitting optical fibers 1080 and light-receiving optical fibers 1082 which are used in a variation of the eighth embodiment. In this variation, a bundle of a plurality of light-receiving optical fibers 1082 is surrounded by a plurality of light-emitting optical fibers 1080. With this arrangement, it is possible to improve a light-receiving efficiency of measurement light by the light-receiving optical fibers 1082.

As described above, the light-emitting optical fibers 1080 and the light-receiving optical fibers 1082 are disposed in a supply passage 42 for a fluid for measurement. Accordingly, paths of measurement light may be influenced by a polishing abrasive mixed in the fluid for measurement. In this variation, since the light-emitting optical fibers 1080 are disposed around the light-receiving optical fibers 1082, reflected light can be received in every direction around the light-receiving optical fibers 1082, so that the paths of measurement light are unlikely to be influenced by a polishing abrasive.

Next, a substrate polishing apparatus 10 according to a ninth embodiment of the present invention will be described below. The substrate polishing apparatus 10 in the ninth embodiment basically has the same arrangement as the substrate polishing apparatus 10 in the second embodiment.

Figure 27:
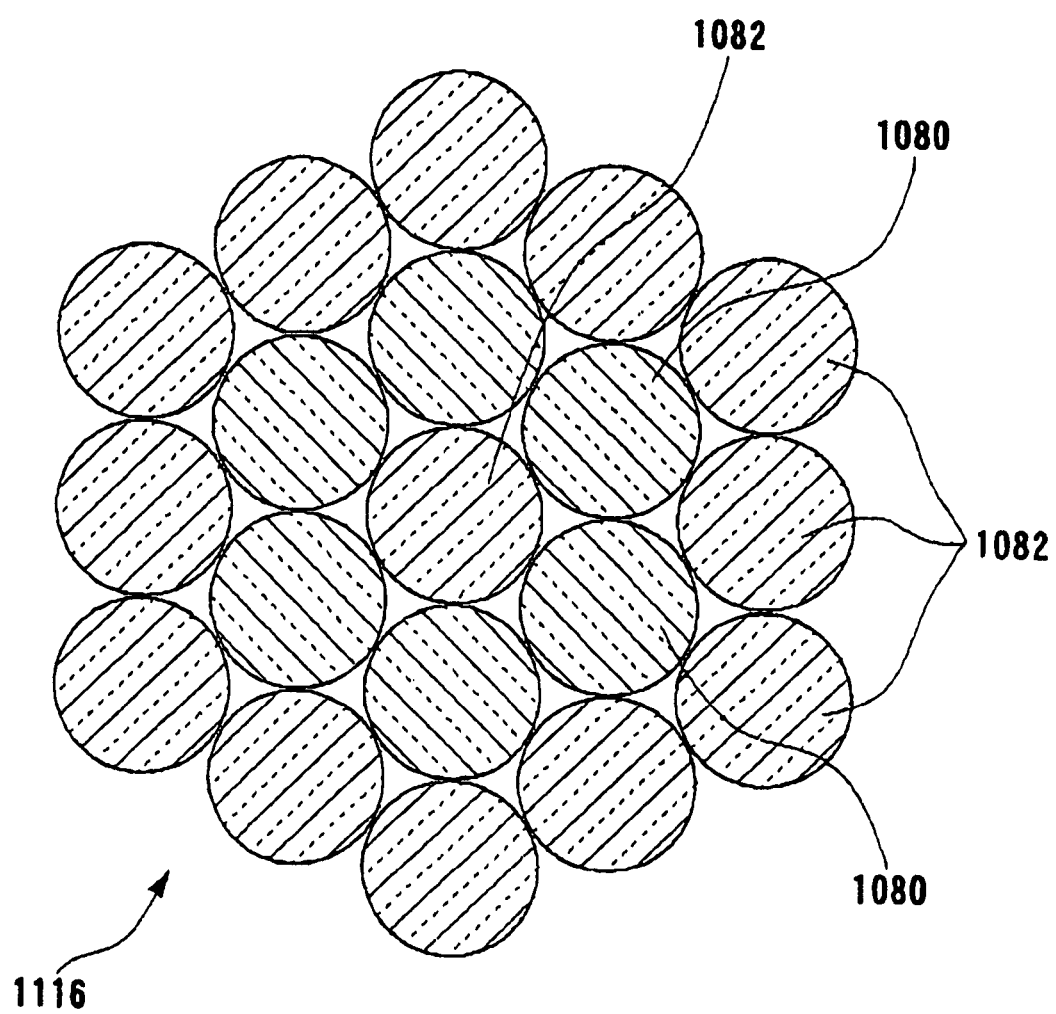
FIG. 27 is a cross-sectional view of light-emitting optical fibers and light-receiving optical fibers which are used in a ninth embodiment of the present invention.

FIG. 27 is a cross-sectional view of light-emitting optical fibers 1080 and light-receiving optical fibers 1082 which are used in the substrate polishing apparatus 10 according to the ninth embodiment. The light-emitting optical fibers 1080 and the light-receiving optical fibers 1082 form an optical fiber member 1116. In the ninth embodiment, a plurality of light-emitting optical fibers 1080 and a plurality of light-receiving optical fibers 1082 are bundled together, as with the seventh embodiment. In the ninth embodiment, a plurality of light-emitting optical fibers 1080 surrounds a light-receiving optical fiber 1082, and light-receiving optical fibers 1082 surrounds the plurality of optical fibers 1080. With this arrangement, it is possible to improve a light-receiving efficiency of measurement light by the light-receiving optical fibers 1082.

Figure 28:
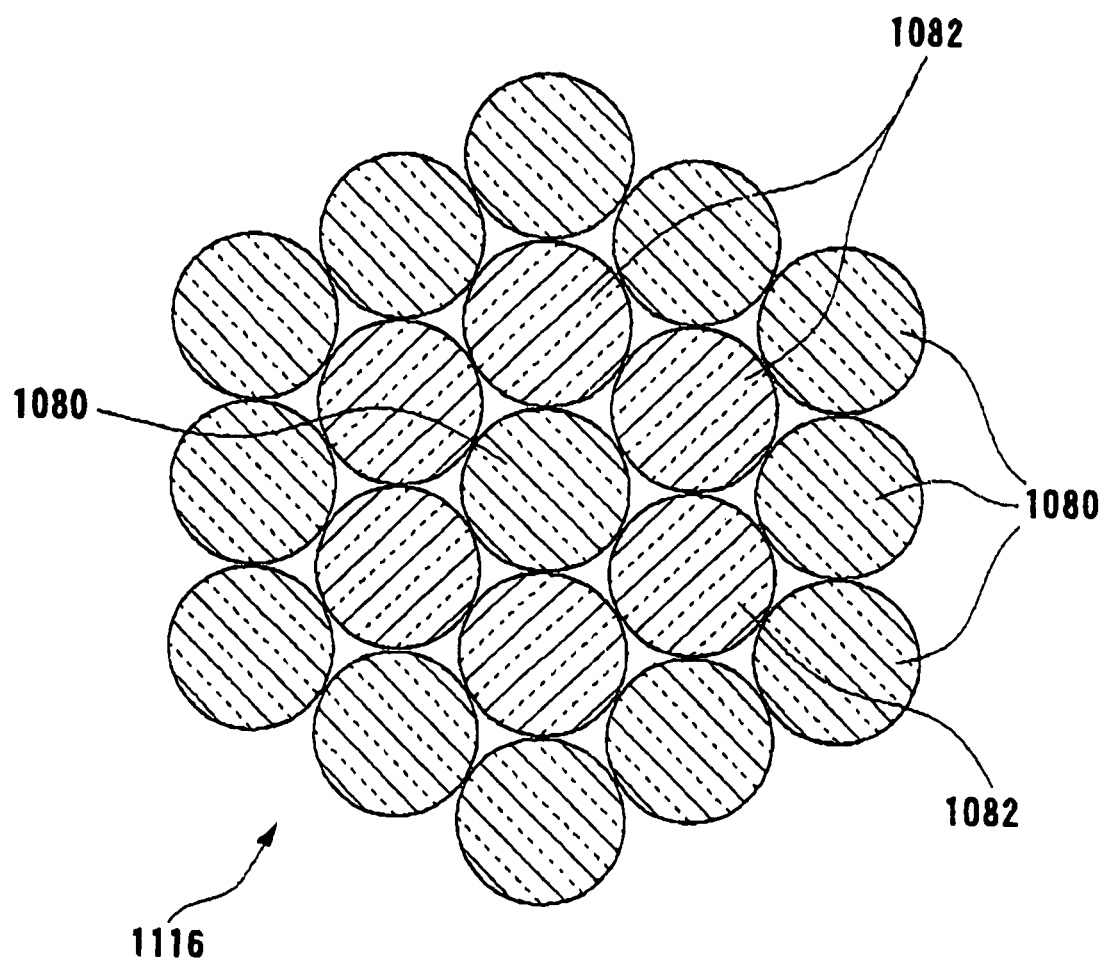
FIG. 28 is a cross-sectional view of light-emitting optical fibers and light-receiving optical fibers which are used in a variation of the ninth embodiment.

FIG. 28 is a cross-sectional view of light-emitting optical fibers 1080 and light-receiving optical fibers 1082 which are used in a variation of the ninth embodiment. The light-emitting optical fibers 1080 and the light-receiving optical fibers 1082 form an optical fiber member 1116. In this variation, an arrangement of the light-emitting optical fibers 1080 and the light-receiving optical fibers 1082 is opposite from that in the ninth embodiment. Specifically, a plurality of light-receiving optical fibers 1082 surrounds a light-emitting optical fiber 1080, and light-emitting optical fibers 1080 surround the plurality of optical fibers 1082. With this variation, it is possible to improve a light-receiving efficiency of measurement light by the light-receiving optical fibers 1082, as with the ninth embodiment.

Next, a substrate polishing apparatus 10 according to a tenth embodiment of the present invention will be described below. The substrate polishing apparatus 10 in the tenth embodiment basically has the same arrangement as the substrate polishing apparatus 10 in the second embodiment.

Figure 29:
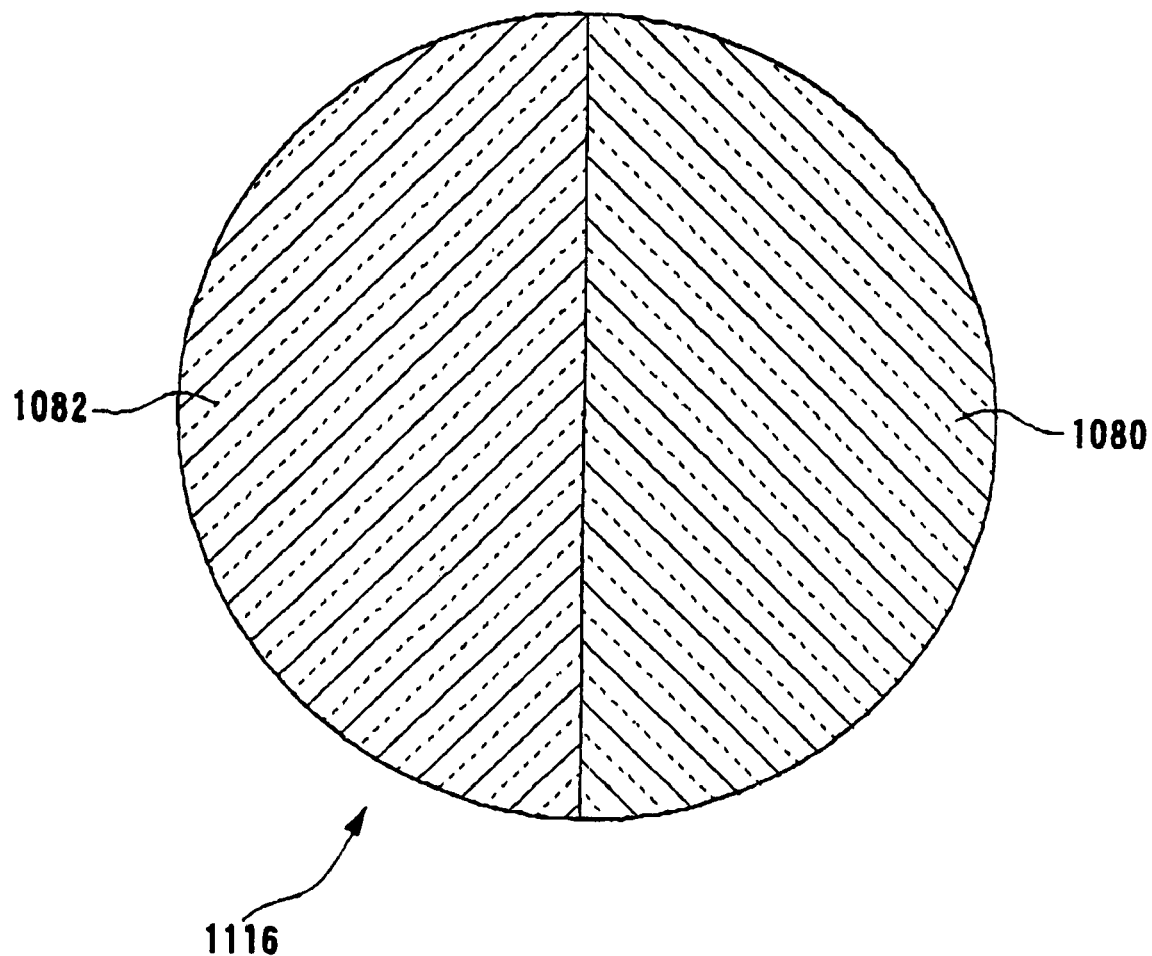
FIG. 29 is a cross-sectional view of an optical fiber member used in a tenth embodiment of the present invention.

FIG. 29 is a cross-sectional view showing an optical fiber member 1116 to emit measurement light and receive reflected light in the substrate polishing apparatus 10 according to the tenth embodiment. In the tenth embodiment, there is formed a composite optical fiber member 1116 having a divided region of a light-emitting optical fiber 1080 and a divided region of a light-receiving optical fiber 1082. Specifically, the optical fiber member 1116 has a light-emitting optical fiber region 1080 having a semicircular cross-section and a light-receiving optical fiber region 1082 having a semicircular cross-section. The respective regions are separated from each other by a common clad. This optical fiber member 1116 achieves a function as a light-emitting optical fiber 1080 and a function as a light-receiving optical fiber 1082.

This arrangement allows the light-emitting optical fiber region 1080 and the light-receiving optical fiber region 1082 to be located adjacent to each other via the common clad. With this arrangement, since there is a small interval between a core of the light-emitting optical fiber region 1080 and a core of the light-receiving optical fiber region 1082, it is possible to enlarge an overlapping area of an application area by a light-emitting optical fiber 1080 and a light-receivable area by a light-receiving optical fiber 1082.

Accordingly, the light-emitting optical fiber 1080 and the light-receiving optical fiber 1082 can be brought closer to the substrate 20.

Further, a lens may be attached to ends of the light-emitting optical fiber region 1080 and the light-receiving optical fiber region 1082 so as to cover the light-emitting optical fiber region 1080 and the light-receiving optical fiber region 1082, as with the fifth embodiment.

Thus, a substrate polishing apparatus 10 according to the present invention has been described in detail with preferred embodiments. However, the present invention is not limited to the above embodiments.

In the above embodiments, positions at which the light-emitting optical fiber 1080 and the light-receiving optical fiber 1082 are disposed are calculated based on an angle of divergence, and the light-emitting optical fiber 1080 and the light-receiving optical fiber 1082 are disposed at the calculated positions. However, positions at which the light-emitting optical fiber 1080 and the light-receiving optical fiber 1082 may not be fixed. A light-emitting optical fiber and a light-receiving optical fiber may be connected to a driving means such as a precision ball screw or a piezoelectric element, and positions of a light-emitting optical fiber and a light-receiving optical fiber may be adjusted based on an optimal distance L from a substrate, which is calculated as with the above embodiments. With this arrangement, positions of the light-emitting optical fiber and the light-receiving optical fiber can be controlled in a feed-back manner according to degree of abrasion of a polishing pad during polishing.

Although certain preferred embodiments of the present invention have been described above, it should be understood that the present invention is not limited to the above embodiments, and that various changes and modifications may be made therein without departing from the scope of the technical concept.

As described above, according to the present invention illustrated in FIGS. 9 through 29, with an arrangement in which an emitting end of a light-emitting optical fiber and an incident end of a light-receiving optical fiber are located adjacent to each other, a path of measurement light emitted from the light-emitting optical fiber and entering the light-receiving optical fiber becomes substantially perpendicular to a substrate. Therefore, it is possible to increase the quantity of light received by the light-receiving optical fiber.

According to the present invention, attention is drawn to the fact that an effective application area can be represented by angles of divergence of a light-emitting optical fiber and a light-receiving optical fiber. Thus, a distance from the light-emitting optical fiber and the light-receiving optical fiber is determined based on an angle of divergence. As a result, the light-emitting optical fiber and the light-receiving optical fiber can be located at optimal positions in view of enhancing a light-receiving efficiency.

The invention claimed is:

1. A substrate polishing apparatus comprising:
    a rotatable polishing table against which a substrate is pressed, said rotatable polishing table having a fluid chamber provided at a light emitting and light-receiving position thereof;
    a light-emitting and light-receiving device to emit measurement light from said rotatable polishing table to the substrate and to receive reflected light from the substrate;
    a first passage for a high flow rate, said first passage introducing a fluid, through which the measurement light and the reflected light pass, to said fluid chamber of said rotatable polishing table;
    a second passage for a low flow rate, said second passage being restricted as compared to said first passage for the high flow rate which introduces the fluid to said fluid chamber;
    a rotational angle sensor for detecting an angular position of said rotatable polishing table in a rotation direction of said rotatable polishing table; and
    a switching unit for switching into which of said first and second passages the fluid is introduced based on a detection signal of said rotational angle sensor.

2. The substrate polishing apparatus as recited in claim 1, wherein said first passage and said second passage are connected to said fluid chamber.

3. The substrate polishing apparatus as recited in claim 1, wherein the measurement light and the reflected light pass through the fluid for measurement along a direction parallel to a direction in which the fluid flows.

4. A substrate polishing apparatus comprising:
    a rotatable polishing table against which a substrate is pressed, said rotatable polishing table having a fluid chamber at a light-emitting and light receiving position thereof;
    a light-emitting and light-receiving device to emit measurement light from said rotatable polishing table to the substrate and to receive reflected light from the substrate for measuring a film formed on the substrate;
    a fluid supply passage for supplying a fluid for measurement to said fluid chamber of said rotatable polishing table, the measurement light and the reflected light passing through the fluid for measurement;
    a rotational angle sensor for detecting an angular position of said rotatable polishing table in a rotational direction of said rotatable polishing table; and
    a fluid supply control device for controlling supply of the fluid for measurement to said fluid chamber according to a positional relationship between said fluid chamber and the substrate which is detected by said rotational angle sensor,
    wherein said fluid supply passage includes a passage for a high flow rate and a passage for a low flow rate which are connected to said fluid chamber.

* * * * *